United States Patent
Chang et al.

(10) Patent No.: US 12,457,790 B2
(45) Date of Patent: Oct. 28, 2025

(54) SEMICONDUCTOR DEVICE INCLUDING CONDUCTIVE NITRIDE FEATURE AND METHOD OF MAKING THE SEMICONDUCTOR DEVICE

(71) Applicant: TAIWAN SEMICONDUCTOR MANUFACTURING COMPANY, LTD., Hsinchu (TW)

(72) Inventors: Po-Chin Chang, Hsinchu (TW); Yuting Cheng, Hsinchu (TW); Hsu-Kai Chang, Hsinchu (TW); Chia-Hung Chu, Hsinchu (TW); Tzu-Pei Chen, Hsinchu (TW); Shuen-Shin Liang, Hsinchu (TW); Sung-Li Wang, Hsinchu (TW); Pinyen Lin, Hsinchu (TW); Lin-Yu Huang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 695 days.

(21) Appl. No.: 17/854,676

(22) Filed: Jun. 30, 2022

(65) Prior Publication Data
US 2024/0006505 A1    Jan. 4, 2024

(51) Int. Cl.
*H01L 29/45*    (2006.01)
*H10D 64/01*    (2025.01)
*H10D 64/62*    (2025.01)

(52) U.S. Cl.
CPC .............. *H10D 64/62* (2025.01); *H10D 64/01* (2025.01)

(58) Field of Classification Search
None
See application file for complete search history.

(56) References Cited

U.S. PATENT DOCUMENTS

2021/0408115 A1*   12/2021   Lin ...................... H01L 23/528
2022/0310698 A1*    9/2022   Park ...................... H10B 63/20

* cited by examiner

*Primary Examiner* — William C Trapanese
(74) *Attorney, Agent, or Firm* — Birch, Stewart, Kolasch & Birch, LLP

(57) ABSTRACT

A semiconductor device includes a semiconductor structure, a conductive nitride feature, a third dielectric feature, and a conductive line feature. The semiconductor structure includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature disposed in the second dielectric feature and being connected to at least one of the source/drain regions and the gate structure. The conductive nitride feature includes metal nitride or alloy nitride, is disposed in the second dielectric feature, and is connected to the contact feature. The third dielectric feature is disposed over the second dielectric feature. The conductive feature is disposed in the third dielectric feature and is connected to the conductive nitride feature opposite to the contact feature.

20 Claims, 24 Drawing Sheets

SEMICONDUCTOR DEVICE INCLUDING CONDUCTIVE NITRIDE FEATURE AND METHOD OF MAKING THE SEMICONDUCTOR DEVICE

BACKGROUND

Currently, semiconductor devices are widely used in various fields, such as cloud storage, medicine, transportation, mobile devices, etc. The current trend in some aspects of semiconductor device manufacturing focuses on providing semiconductor devices with smaller dimensions and better power efficiency. Therefore, it is desirable to continuously improve the structure and manufacturing of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
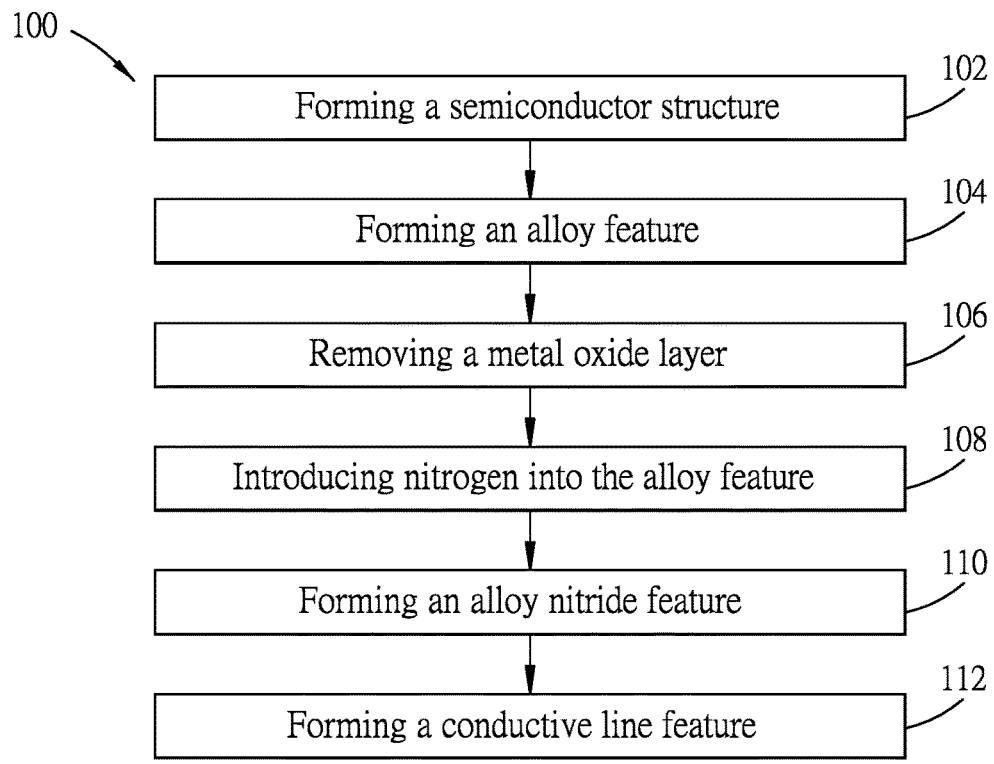
FIG. 1 illustrates a method of making a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. In addition, the term "source/drain region" may refer to a source region or a drain region, individually or collectively dependent upon the context.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 of making a semiconductor device 200 (see FIGS. 28 and 29) in accordance with some embodiments. FIGS. 2 to 29 are schematic views showing intermediate stages of the method 100 as depicted in FIG. 1, where FIGS. 2, 4, 6, 8, 10, 12, 14, 16, 18, 20, 22, 24, 26 and 28 are schematic views taken from the semiconductor device 200 along a direction parallel to fins 206 (see FIG. 3) of the semiconductor device 200, and where FIGS. 3, 5, 7, 9, 11, 13, 15, 17, 19, 21, 23, 25, 27 and 29 are schematic views taken from the semiconductor device 200 along a direction perpendicular to the fins 206. Additional steps which are not limited to those described in the method 100, can be provided before, after or during certain step, and some of the steps described herein may be replaced by other steps or be eliminated. Similarly, additional features may be present, and/or features present may be replaced or eliminated in additional embodiments.

Figure 2:
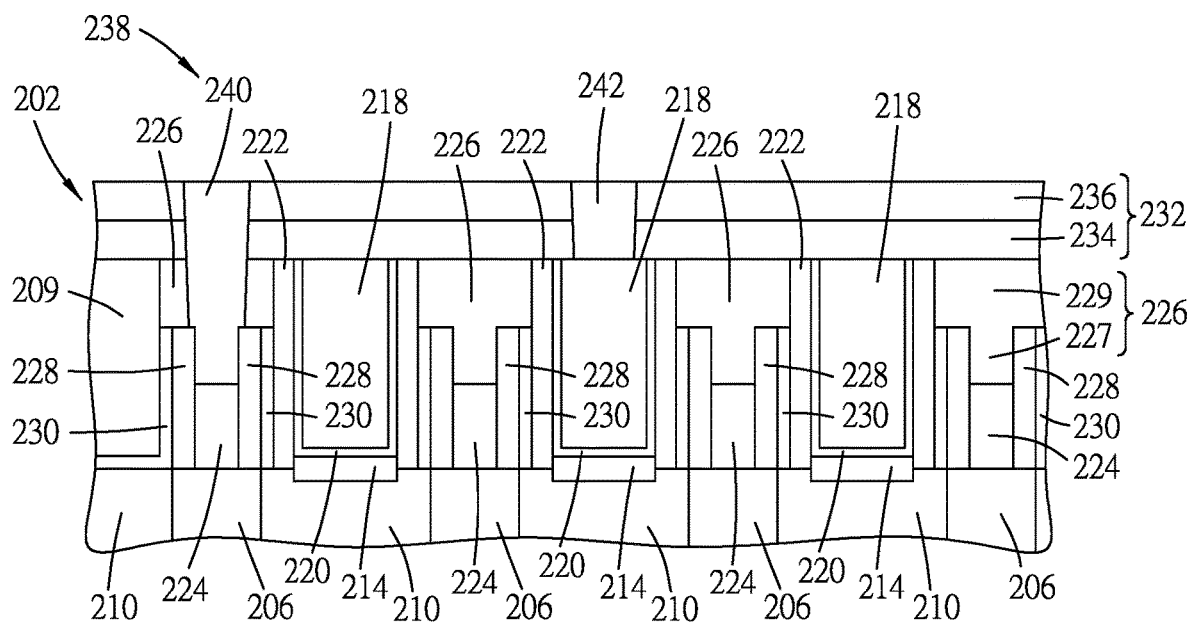
FIGS. 2 to 29 show intermediate steps of a method of making a semiconductor device in accordance with some embodiments.
Figure 3:
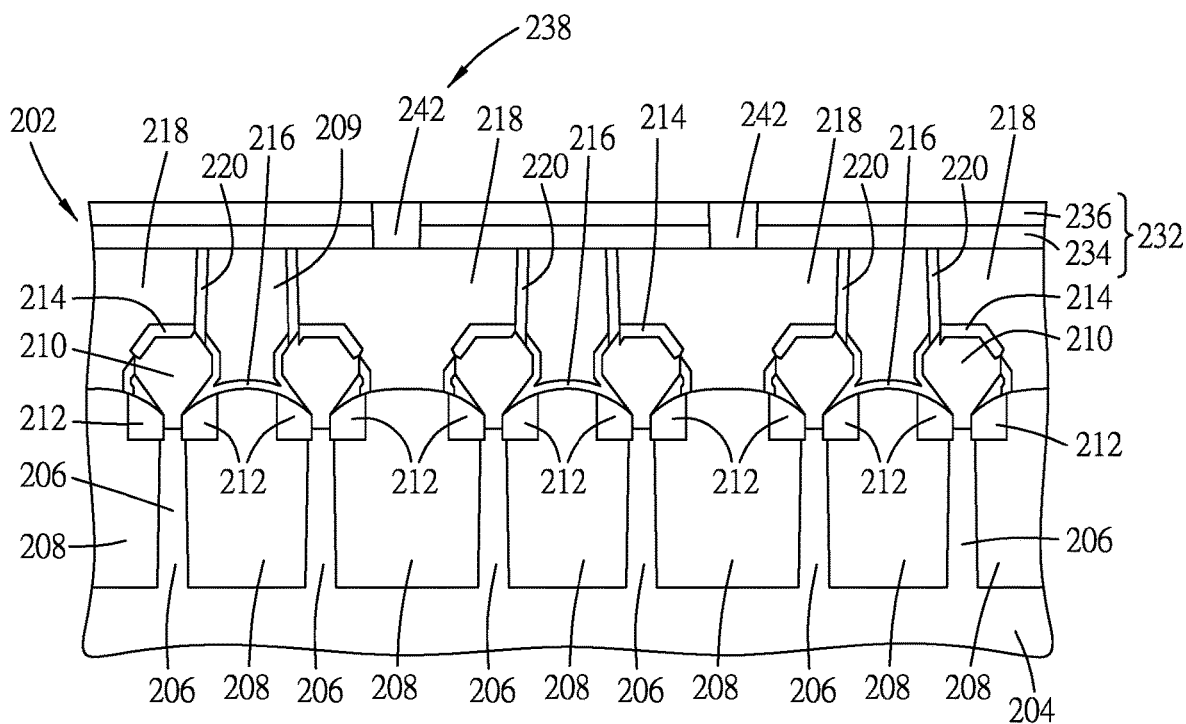

Referring to FIG. 1, in a step 102 of the method 100, a semiconductor structure is formed. Referring to FIGS. 2 and 3, in some embodiments, the semiconductor structure 202 includes a substrate 204, a plurality of the fins 206, a plurality of shallow trench isolation (STI) layers 208, a first dielectric feature 209, a plurality of source/drain regions 210, a plurality of source/drain spacers 212, a plurality of silicide structures 214, a plurality of contact etch stop layers (CESLs) 216, a plurality of contact structures 218, a plurality of contact liners 220, a plurality of contact spacers 222, a plurality of gate structures 224, a plurality of mask layers 226, a plurality of first gate spacers 228, a plurality of second gate spacers 230, a second dielectric feature 232, and a contact feature 238. In some embodiments, the semiconductor structure 202 may include a fin field-effect transistor (FinFET) structure, a nanosheet structure, a nonowire structure, a silicon-on-insulator (SOI) semiconductor structure, other suitable semiconductor structures, or any combination thereof.

In some embodiments, the substrate 204 may include, for example, but not limited to, an elemental semiconductor or a compound semiconductor. The elemental semiconductor includes a single species of atoms, such as Si or Ge in column XIV of the periodic table, and may be crystalline, polycrystalline, or an amorphous structure. Other suitable materials are within the contemplated scope of the present disclosure. The compound semiconductor includes two or more elements, and examples thereof may include, but are not limited to, SiC, GaAs, GaP, InP, InAs, InSb, SiGe, GaAsP, AlInAs, AlGaAs, GaInAs, GaInP, and GaInAsP. Other suitable materials are within the contemplated scope of the present disclosure. The compound semiconductor may have a gradient feature in which the composition ratio thereof changes from one location to another location in the compound semiconductor. The compound semiconductor may be formed over a silicon substrate, and the compound semiconductor may be strained. In some embodiments, the substrate 204 may include a multilayer compound semiconductor structure. In some embodiments, the substrate 204 may be a semiconductor-on-insulator (SOI) (e.g., silicon germanium-on-insulator (SGOI)). Generally, an SOI substrate includes a layer of a semiconductor material such as epitaxial silicon, germanium, silicon germanium, or any combination thereof. Other suitable materials are within the contemplated scope of the present disclosure. The SOI substrate may be doped with a P-type dopant, for example, but not limited to, Br, Al, or Ga. Other suitable materials are within the contemplated scope of the present disclosure. Alternatively, the SOI substrate may be doped with an N-type dopant, for example, but not limited to, N, P, or As. Other suitable materials are within the contemplated scope of the present disclosure.

In some embodiments, the fins 206 are disposed over the substrate 204 and are spaced apart from each other by the STI layers 208. In some embodiments, the STI layers 208 may be made of an insulating material, such as silicon oxide, or other suitable materials, and may be made by chemical vapor deposition (CVD), other suitable techniques, or any combination thereof.

In some embodiments, each of the source/drain spacers 212 may be disposed between one of the source/drain regions 210 and a corresponding one of the STI layers 208. In some embodiments, the source/drain spacers 212 may include silicon oxide, silicon nitride, silicon carbide, silicon oxycarbide, silicon oxynitride, silicon carbonitride, silicon oxycarbonitride, boron nitride, silicon boron nitride, other suitable materials, or any combination thereof. In some embodiments, the source/drain spacers 212 may be formed by CVD, atomic layer deposition (ALD), physical vapor deposition (PVD), other suitable techniques, or any combination thereof.

In some embodiments, the first dielectric feature 209 is disposed over the substrate 204 and the STI layers 208, and may include a dielectric material, such as silicon oxide, silicon nitride, silicon oxynitride, amorphous fluorinated carbon, fluorinated silica glass (FSG), carbon doped silicon oxide (e.g., SiCOH), polyimide, parylene, bis-benzocyclobutenes (BCB), other suitable materials, or any combination thereof. In some embodiments, the first dielectric feature 209 may be formed by CVD, PVD, ALD, other suitable techniques, or any combination thereof.

In some embodiments, the source/drain regions 210 may be disposed in the substrate 204, and may be respectively disposed over the fins 206. In some embodiments, the source/drain regions 210 may be formed by epitaxial growth techniques, other suitable techniques, or any combination thereof, and may be made of crystalline silicon (or other suitable semiconductor materials) doped with P-type dopants, so as to form P-type S/D regions for PMOS (P-type metal oxide semiconductor) transistors. In some embodiments, the P-type dopants may be boron, aluminum, gallium, indium, $BF_2$, other suitable materials, or any combination thereof. In some embodiments, the source/drain regions 210 may be made of crystalline silicon (or other suitable semiconductor materials) doped with N-type dopants, so as to form N-type S/D regions for NMOS (N-type metal oxide semiconductor) transistors. In some embodiments, the N-type dopants may be phosphorous, nitrogen, arsenic, antimony, other suitable materials, or any combination thereof. In some embodiments, each of the source/drain regions 210 may include one or multiple layers of semiconductor materials.

In some embodiments, the silicide structures 214 may be respectively formed in the source/drain regions 210, and may be formed by a pre-silicidation implantation process in which implant regions are formed in the source/drain regions 210, followed by a silicidation process in which the implant regions are subjected to a silicidation process so as to form the silicide structures 214. In some embodiments during the pre-silicidation implantation process, dopants (e.g., metal dopants, etc.) are implanted in the source/drain regions 210. In some embodiments, the silicide structures 214 may include a metal silicide material, such as titanium silicide ($Ti_xSi_y$), molybdenum silicide ($Mo_xSi_y$), nickel silicide ($Ni_xSi_y$), ruthenium silicide ($Ru_xSi_y$), cobalt silicide ($Co_xSi_y$), tungsten silicide ($W_xSi_y$), europium silicide ($Eu_xSi_y$), erbium silicide ($Er_xSi_y$), titanium germanosilicide ($Ti_xSi_yGe_z$), molybdenum germanosilicide ($Mo_xSi_yGe_z$), nickel germanosilicide ($Ni_xSi_yGe_z$), ruthenium germanosilicide ($Ru_xSi_yGe_z$), cobalt germanosilicide ($Co_xSi_yGe_z$), tungsten germanosilicide ($W_xSi_yGe_z$), europium germanosilicide ($Eu_xSi_yGe_z$), erbium germanosilicide ($Er_xSi_yGe_z$), other suitable materials, or any combination thereof. In some embodiments, the metal silicide material may be subjected to a nitridation treatment to reduce oxidation thereof. For example, titanium silicide may be subjected to a nitridation treatment so as to form titanium silicon nitride (TiSiN), and nickel silicide may be subjected to a nitridation treatment so as to form nickel silicon nitride (NiSiN).

In some embodiments, the CESLs 216 are disposed around the source/drain regions 210, and may include LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof. In some embodiments, the CESLs 216 may be formed by CVD, ALD, PVD, other suitable techniques, or any combination thereof.

In some embodiments, the contact structures 218 may be disposed in the first dielectric feature 209, and may be connected to the source/drain regions 210 through the silicide structures 214. As shown in FIG. 3, in some embodiments, each of the contact structures 218 is connected to corresponding two of the source/drain regions 210. However, the number of the source/drain region(s) 210 that each of the contact structures 218 is connected to may be changed according to practical requirements. In some embodiments, each of the contact structures 218 may be referred to as MD (metal over diffusion). In some embodiments, the contact liners 220 are disposed adjacent to the contact structures 218, and may be made of nitride-based materials, other suitable types of materials, or any combination thereof. In some embodiments, the contact liners 220 may be made by CVD, ALD, PVD, other suitable techniques, or any combination thereof. In some embodiments, the contact spacers 222 are disposed adjacent to the contact liners 220, may include silicon oxide, silicon nitride, silicon carbide, silicon oxycarbide, silicon oxynitride, silicon carbonitride, silicon oxycarbonitride, boron nitride, silicon boron nitride, other suitable materials, or any combination thereof, and may be made by CVD, ALD, PVD, other suitable techniques, or any combination thereof.

In some embodiments, the gate structures 224 are disposed adjacent to the contact structures 218. In some embodiments, each of the gate structures 224 may include a gate dielectric and a metal gate, where the gate dielectric may include metal oxides (where the metal may include Li, Be, Mg, Ca, Sr, Sc, Y, Zr, Hf, Al, La, Ce, Pr, Nd, Sm, Eu, Gd, Tb, Dy, Ho, Er, Tm, Yb, Lu, other suitable metals, or any combination thereof), metal nitrides, metal silicates, metal oxynitrides, metal aluminates, silicon oxide, silicon nitride, silicon oxynitride, other suitable materials, or any combination thereof, and the metal gate may include polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, other suitable materials, or any combination thereof. In some embodiments, the gate dielectric and the metal gate of each of the gate structures 224 may be formed by CVD, ALD, PVD, other suitable techniques, or any combination thereof. In some embodiments, the first gate spacers 228 and the second gate spacers 230 are disposed adjacent to the gate structures 224, may include silicon oxide, silicon nitride, silicon carbide, silicon oxycarbide, silicon oxynitride, silicon carbonitride, silicon oxycarbonitride, other suitable materials, or any combination thereof, and may be made by CVD, ALD, PVD, other suitable techniques, or any combination thereof.

In some embodiments, the mask layers 226 are disposed over the gate structures 224, may include LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof, and may be made by CVD, ALD, PVD, other suitable techniques, or any combination thereof. In some embodiments, each of the mask layers 226 may be referred to as self-aligned contact (SAC). In some embodiments, each of the mask layers 226 may have a thickness ranging from about 1 nm to about 50 nm, but other ranges of values are also within the scope of this disclosure. In some embodiments, if the thickness of each of the mask layers 226 is too small, such as smaller than about 1 nm, the mask layers 226 may be able to serve as etching masks during the process of making the semiconductor structure 202. In some embodiments, if the thickness of each of the mask layers 226 is too large, such as larger than about 50 nm, it may be difficult to etch the mask layers 226 for forming the contact feature 238. In some embodiments, each of the mask layers 226 may include a first mask portion 227 and a second mask portion 229 disposed over the first mask portion 227. In some embodiments, one of the first and second mask portions 227, 229 of each of the mask layers 226 may be omitted, according to practical requirements. In some embodiments, the first mask portion 227 of each of the mask layers 226 may have a thickness ranging from about 1 nm to about 50 nm, but other ranges of values are also within the scope of this disclosure. In some embodiments, the second mask portion 229 of each of the mask layers 226 may have a thickness ranging from about 1 nm to about 30 nm, but other ranges of values are also within the scope of this disclosure.

In some embodiments, the second dielectric feature 232 is disposed over the first dielectric feature 209, and may include a first dielectric layer 234 disposed over the first dielectric feature 209 and a second dielectric layer 236 disposed over the first dielectric layer 234. In some embodiments, the first dielectric layer 234 may be an etch stop layer (e.g., a contact etch stop layer (CESL)), may include LaO, AlO, YO, TaCN, ZrSi, SiOCN, SiOC, SiCN, ZrN, ZrAlO, TiO, TaO, ZrO, HfO, SiN, HfSi, AlON, SiO, SiC, ZnO, other suitable materials, or any combination thereof, and may be made by CVD, ALD, PVD, other suitable techniques, or any combination thereof. In some embodiments, the second dielectric layer 236 may include LaO, AlO, YO, TaCN, ZrSi, SiOCN, SiOC, SiCN, ZrN, ZrAlO, TiO, TaO, ZrO, HfO, SiN, HfSi, AON, SiO, SiC, ZnO, other suitable materials, or any combination thereof, and may be made by CVD, ALD, PVD, other suitable techniques, or any combination thereof. In some embodiments, the second dielectric layer 236 may be omitted, according to practical requirements.

In some embodiments, the contact feature 238 is disposed in the second dielectric feature 232. In some embodiments, the contact feature 238 may include a plurality of gate contacts 240 (only one is schematically shown in FIG. 2) and a plurality of source/drain contacts 242. In some embodiments, each of the gate contacts 240 may extend through the first dielectric layer 234 and the second dielectric layer 236 of the second dielectric feature 232 and a corresponding one of the mask layers 226 to be connected to a corresponding one of the gate structures 224. In some embodiments, each of the source/drain contacts 242 may extend through the first dielectric layer 234 and the second dielectric layer 236 of the second dielectric feature 232 to be connected to a corresponding one of the contact structures 218. In some embodiments, each of the gate contacts 240 and the source/drain contacts 242 of the contact feature 238 may include a metal (M1) that includes W, Mo, Ru, Co, Ni, Ir, Rh, Os, other suitable materials, or any combination thereof, and may be made by PVD, plating (including electroplating, electroless plating, etc.), CVD, ALD, other suitable techniques, or any combination thereof. In some embodiments, a plurality of glue layers (not shown) may be provided to respectively surround the gate contacts 240 and the source/drain contacts 242, and may include TiN, TaN, other suitable materials, or any combination thereof.

Figure 4:
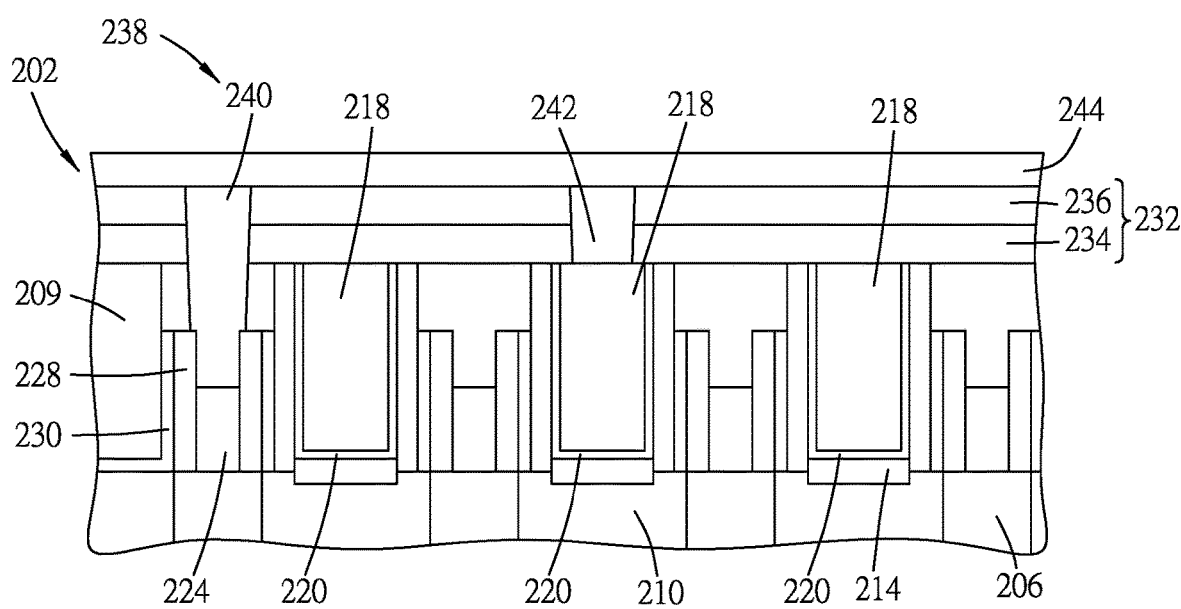
Figure 5:
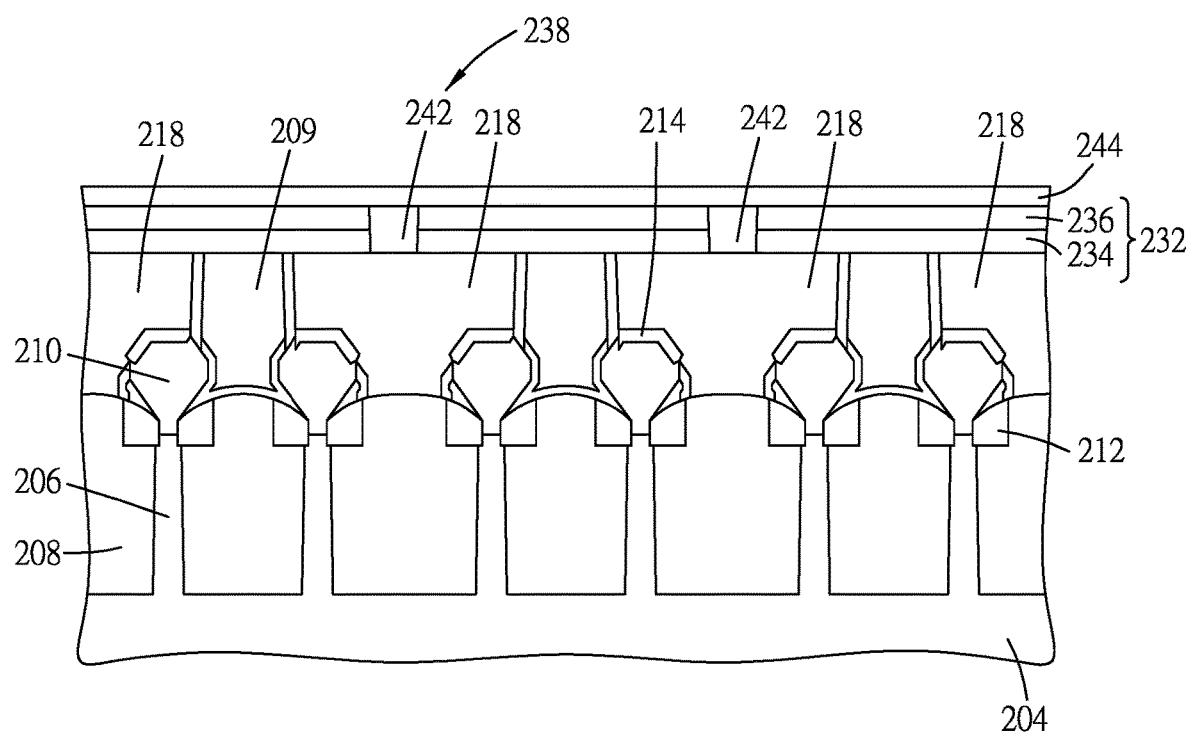
Figure 6:
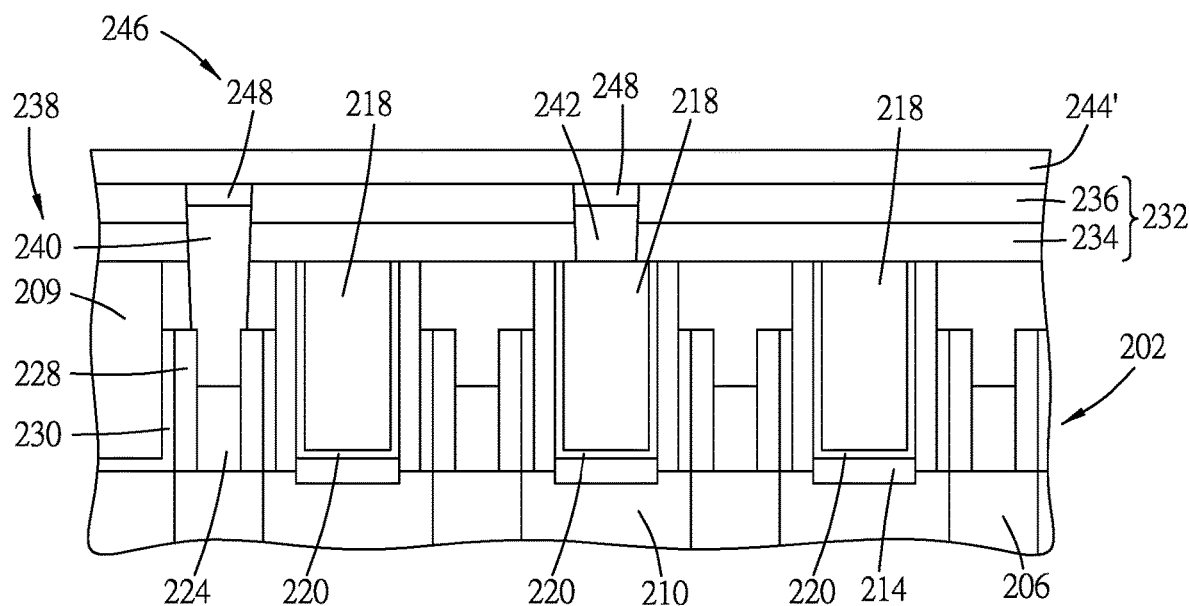
Figure 7:
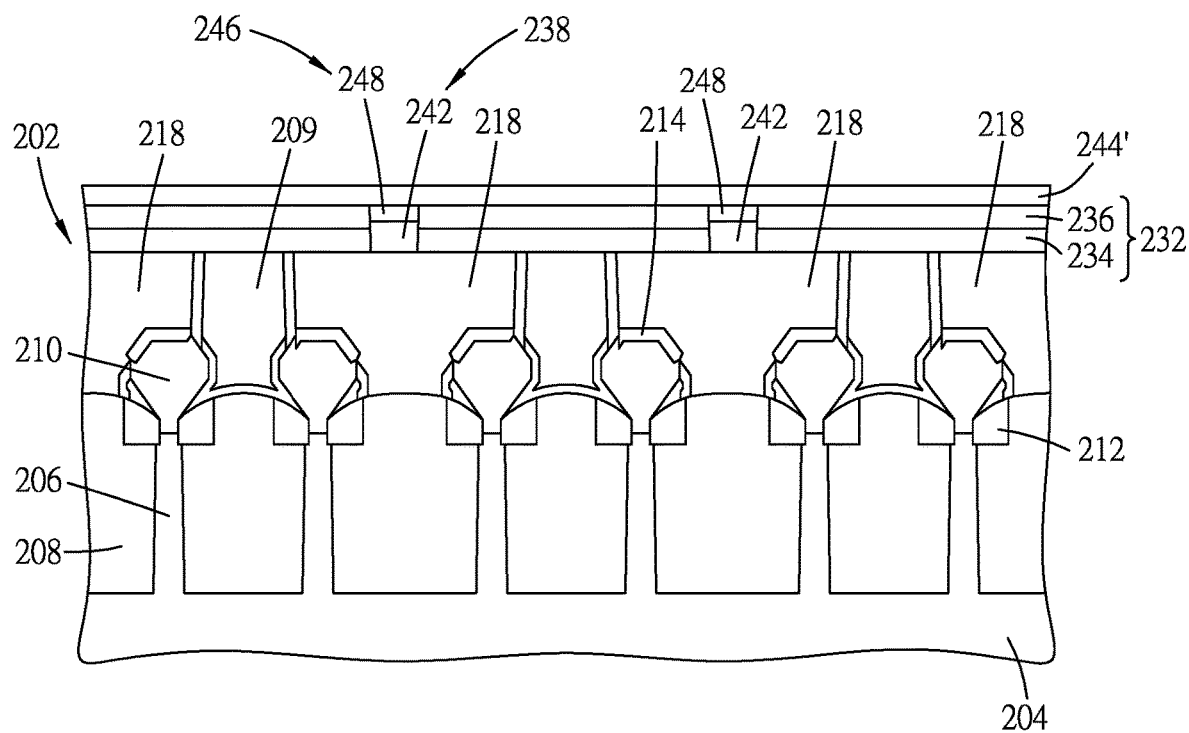

Referring to FIG. 1, in a step 104 of the method 100, an alloy structure is formed. Referring to FIGS. 4 and 5, in some embodiments, a metal layer 244 may be formed over the second dielectric feature 232 and the contact feature 238. In some embodiments, the metal layer 244 may include a metal (M2) that includes Ti, Ta, other suitable materials, or any combination thereof, and may be made by PVD, CVD, other suitable techniques, or any combination thereof. Then, referring to FIGS. 6 and 7, in some embodiments, the semiconductor structure 202 and the metal layer 244 may be heated (e.g., annealed) so that the metal layer 244 may react with the contact feature 238 to form an alloy feature 246. In some embodiments, a portion of each of the gate contacts 240 and the source/drain contacts 242 of the contact feature 238 is reacted with the metal layer 244 to be formed into an alloy structure 248. In some embodiments, the alloy structures 248 of the alloy feature 246 may include an alloy of the metal (M1) from each of the gate contacts 240 and the source/drain contacts 242 of the contact feature 238 and the metal (M2) from the metal layer 244. For example, when each of the gate contacts 240 and the source/drain contacts 242 of the contact feature 238 includes Ru, and the metal layer 244 includes Ti or Ta, each of the alloy structures 248 of the alloy feature 246 includes RuTi or RuTa. In some embodiments, the heating process may be conducted under a protective gas, such as $N_2$, Ar, other suitable types of gas, or any combination thereof, with a gas flow ranging from about 5 sccm to about 1000 sccm but other ranges of values are also within the scope of this disclosure, and with a pressure ranging from about 0.05 torr to about 10 torr but other ranges of values are also within the scope of this disclosure. In some embodiments, if the gas flow of the protective gas is too small, such as smaller than about 5 sccm, the protective gas may not be able to protect the contact feature 238, such as from oxidation, during the heating process. In some embodiments, if the gas flow of the protective gas is too large, such as greater than about 1000 sccm, the vacuum level of a reaction chamber where the semiconductor structure 202 is placed may be too low, leading to contamination in the chamber. In some embodiments, if the pressure is too low, such as lower than about 0.05 torr, the protective gas may not be able to protect the contact feature 238 from oxidation, during the heating process. In some embodiments, if the pressure is too high, such as higher than about 10 torr, the vacuum level of the reaction chamber where the semiconductor structure 202 is placed may be too low, leading to contamination in the chamber. In some embodiments, the heating process may be conducted under a temperature ranging from about 400° C. to about 600° C., but other ranges of values are also within the scope of this disclosure. In some embodiments, if the heating temperature is too low, such as lower than about 400° C., the metal layer 244 may not react with the contact feature 238. In some embodiments, if the heating temperature is too high, such as higher than about 600° C., the semiconductor structure 202 may be negatively affected or damaged. In some embodiments, the time of heating may range from about 5 minutes to about 10 minutes, but other ranges of values are also within the scope of this disclosure. In some embodiments, if the heating time is too short, such as shorter than about 5 minutes, the alloy feature 246 may not be properly formed. In some embodiments, if the heating time is too long, such as longer than about 10 minutes, the semiconductor structure 202 may be negatively affected or damaged. In some embodiments, after the heating process, the metal layer 244 (see FIGS. 4 and 5) may be oxidized into a metal oxide layer 244' (see FIGS. 6 and 7). In some embodiments, the metal layer 244 may be formed by plasma-enhanced CVD (PECVD), where the plasma would facilitates reaction between the metal layer 244 and the contact feature 238, so that the heating process may be omitted or the heating temperature may be lowered.

Figure 8:
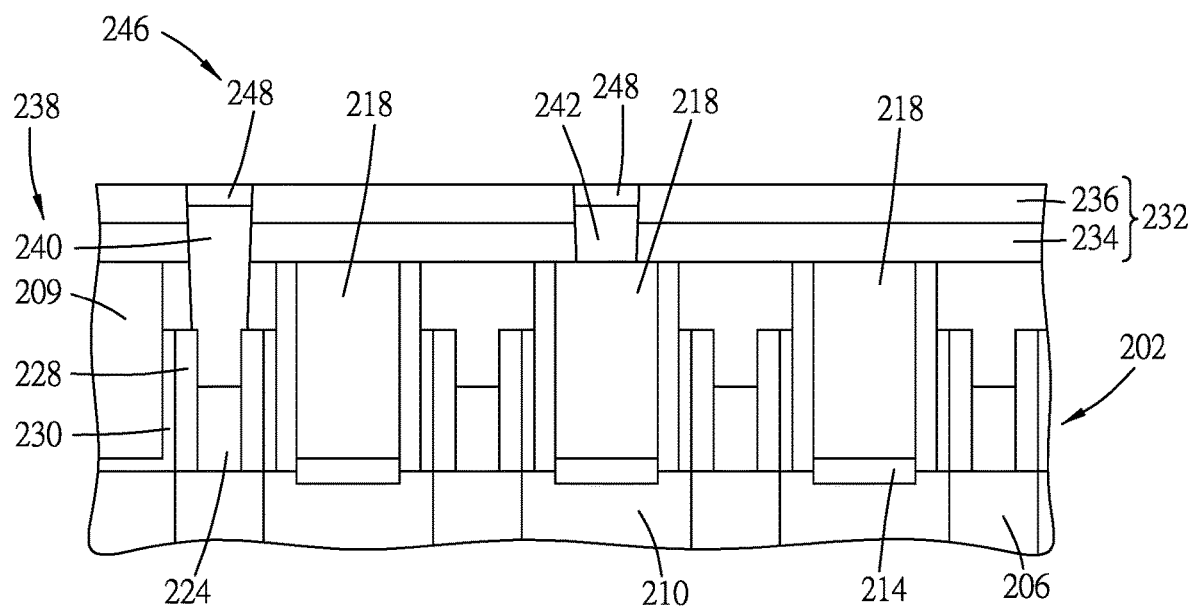
Figure 9:
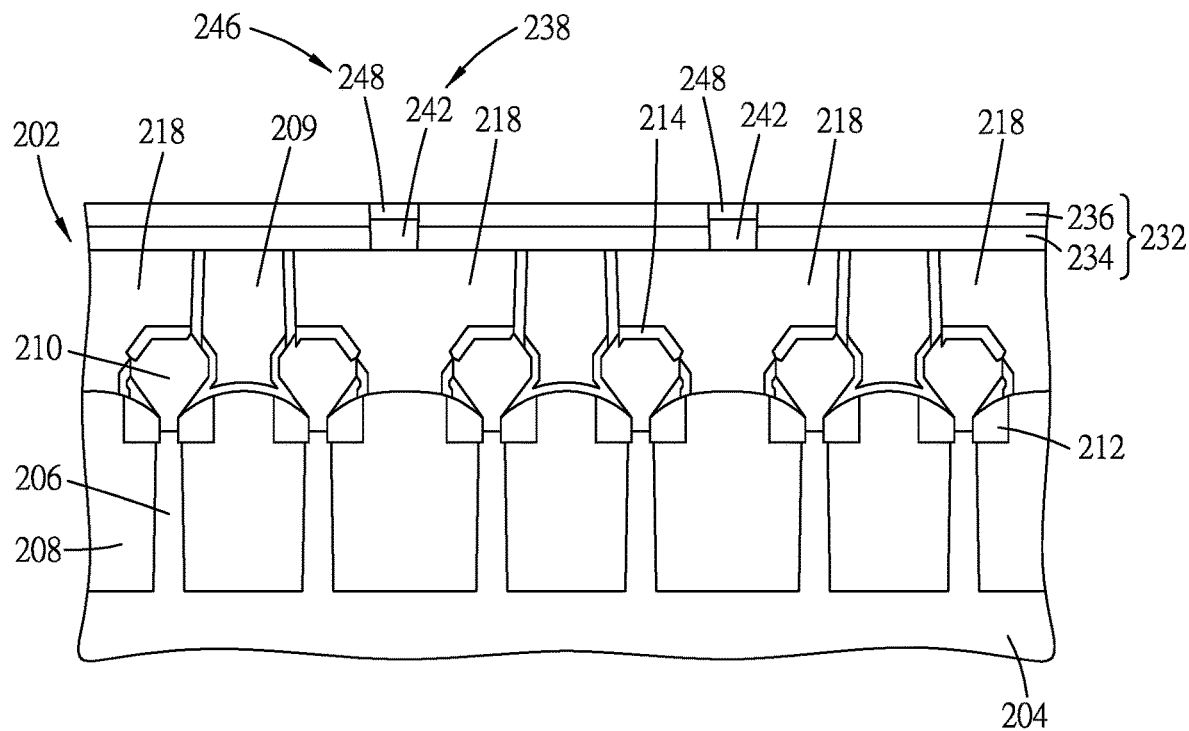
Figure 10:
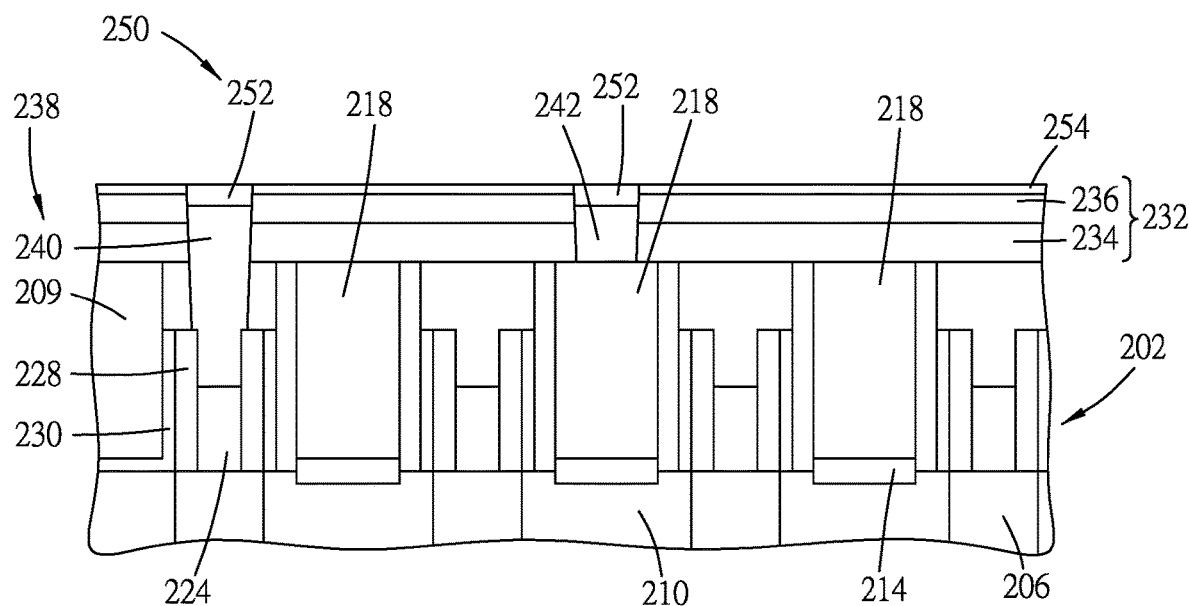
Figure 11:
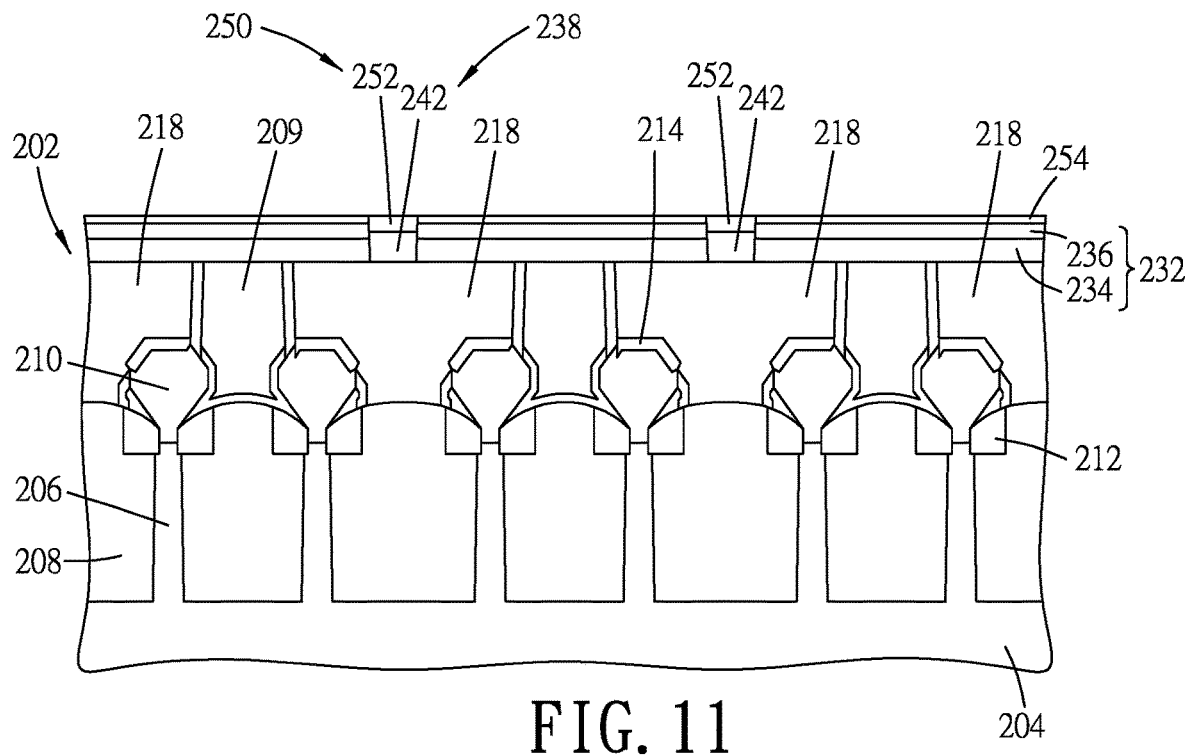
Figure 12:
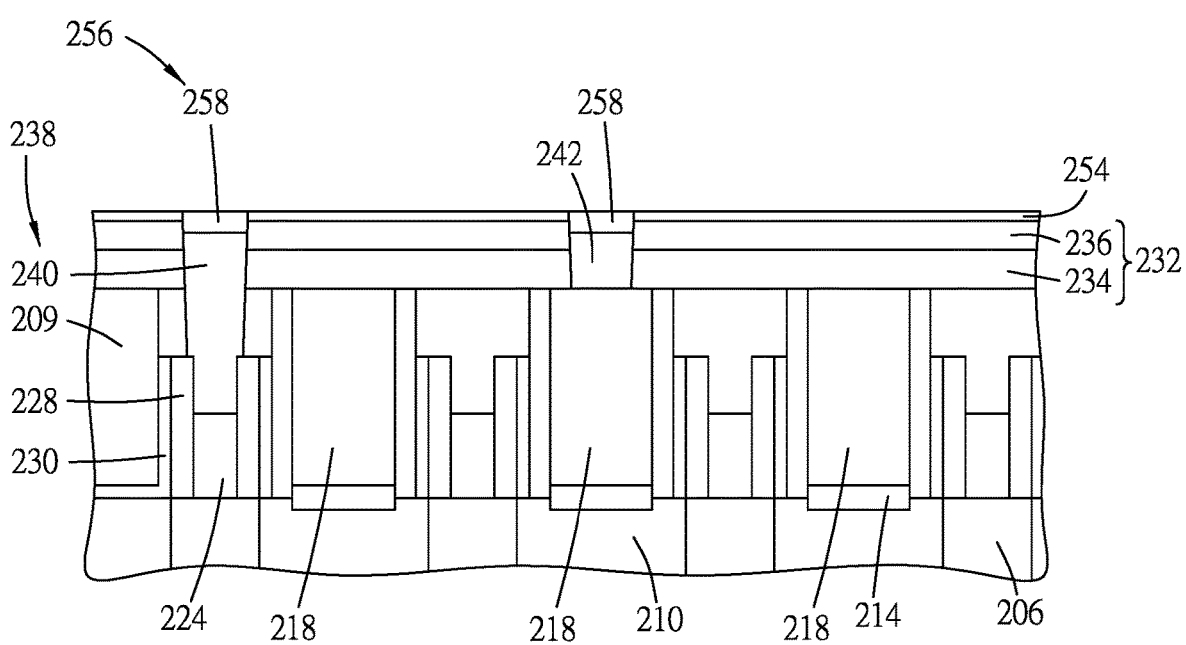
Figure 13:
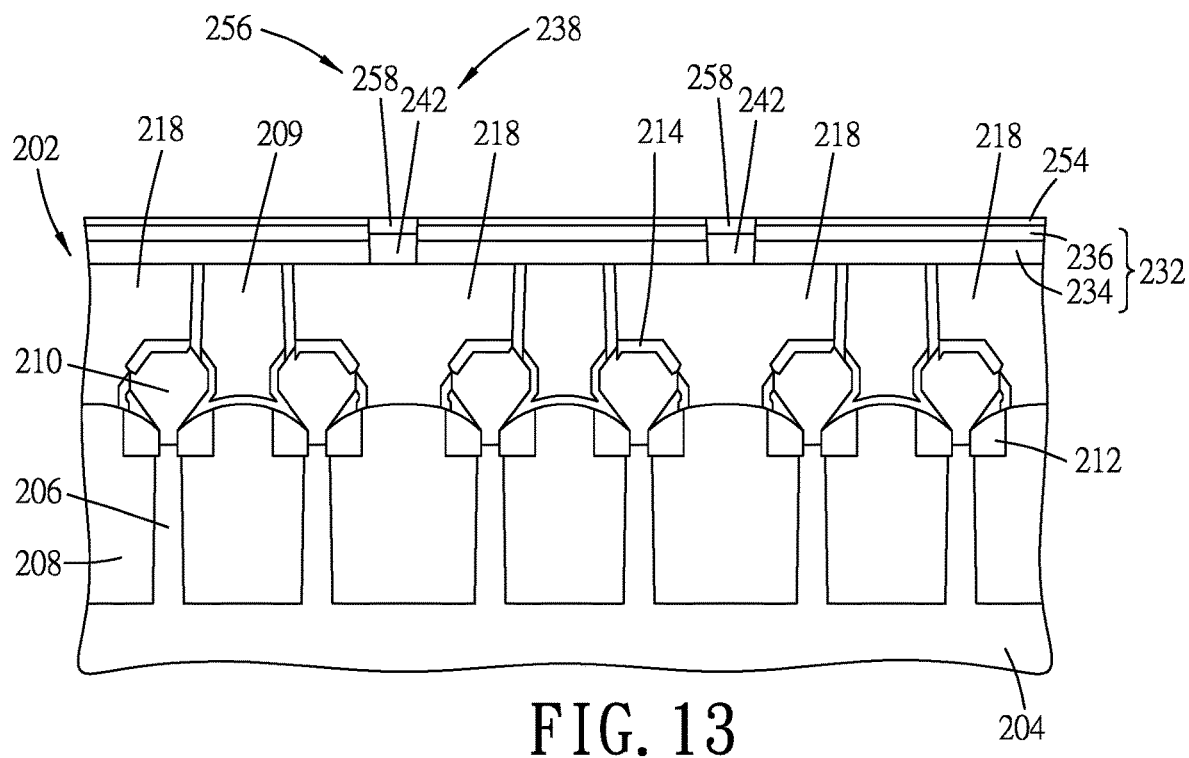

Referring to FIG. 1, in a step 106 of the method 100, the metal oxide layer is removed, which is illustrated by FIGS. 8 and 9. In some embodiments, the metal oxide layer 244' (see FIGS. 6 and 7) may be removed by dry etching, wet etching, other suitable techniques, or any combination thereof. In some embodiments, SC1 solution ($NH_4OH/H_2O_2/H_2O$) may be used for removing the metal oxide layer 244'.

Referring to FIG. 1, in a step 108 of the method 100, nitrogen is introduced into the alloy feature. Referring to FIGS. 8 to 11, nitrogen may be introduced into the alloy feature 246 to turn the alloy feature 246 into a nitrided feature 250 (i.e., the alloy structures 248 are turned into a plurality of nitrided structures 252). In some embodiments, each of the nitrided structures 252 of the nitrided feature 250 may include M1M2 (i.e., the alloy of M1 and M2) added with nitrogen. In some embodiments, alloy structures 248 of the alloy feature 246 may be polycrystalline, and the nitrided structures 252 of the nitrided feature 250 may be amorphous due to the introduction of nitrogen (e.g., by implantation of nitrogen). In some embodiments, a top portion of the second dielectric layer 236 of the second dielectric feature 232 is nitrided to be turned into a nitrided layer 254. In some embodiments, the nitrided layer 254 may include LaON, AlON, YON, TaCN, ZrSiN, SiOCN, SiCN, ZrN, ZrAlON, TiON, TaON, ZrON, HfON, SiN, HfSiN, AlON, SiON, SiCN, ZnON, other suitable materials, or any combination thereof. In some embodiments, the nitrided layer 254 may have a thickness ranging from about 0.5 nm to about 4 nm, but other ranges of values are also within the scope of this disclosure. In some embodiments, a thinner nitrided layer 254 (e.g., the nitrided layer 254 with a thickness smaller than about 0.5 nm) indicates that the nitriding treatment time and/or energy may be insufficient, where the nitrided structures 252 of the nitrided feature 250 may not be properly formed. In some embodiments, a thicker nitrided layer 254 (i.e., the nitrided layer 254 with a thickness greater than about 4 nm) may be attributed to a longer nitriding treatment and/or the nitriding treatment with higher energy, leading to increased resistance of the gate contacts 240 and the source/drain contacts 242 of the contact feature 238. In some embodiments, the introduction of nitrogen may be conducted by nitrogen ($N_2$) implantation technique with an ion beam energy ranging from about 0.6 keV to about 1 keV but other ranges of values are also within the scope of this disclosure, and with an implantation dose ranging from about $1E14$ atom/$cm^2$ to about $1E16$ atom/$cm^2$ but other ranges of values are also within the scope of this disclosure. In some embodiments, the implantation angle may range from about 0° to about 5° but other ranges of values are also within the scope of this disclosure. In some embodiments, if the ion beam energy is too low, such as lower than about 0.6 keV, nitrogen may not be properly introduced into the alloy structures 248 of the alloy feature 246. In some embodiments, if the ion beam energy is too high, such as higher than about 1 keV, the semiconductor structure 202 may be damaged. In some embodiments, if the implantation dose is too low, such as lower than about $1E14$ atom/$cm^2$, nitrogen may not be properly introduced into the alloy structures 248 of the alloy feature 246. In some embodiments, if the implantation dose is too high, such as higher than about $1E16$ atom/$cm^2$, the semiconductor structure 202 may be damaged. In some embodiments, if the implantation angle is too large, such as larger than about 5°, nitrogen may not be properly introduced into the alloy structures 248 of the alloy feature 246. In some embodiments, the introduction of nitrogen may be conducted by treating the alloy structures 248 of the alloy feature 246 with a nitrogen-containing plasma, such as a $NH_3$ plasma, a $N_2$ plasma, other suitable types of plasma, or any combination thereof. In some embodiments, the nitrogen-containing plasma may be mixed with hydrogen for reducing oxidized portions of the alloy structures 248 of the alloy feature 246. In some embodiments, the nitrogen-containing plasma may be generated under a pressure ranging from about 0.05 torr to about 10 torr, but other ranges of values are also within the scope of this disclosure. In some embodiments, if the pressure of the nitrogen-containing plasma is too low, such as lower than about 0.05 torr, nitrogen may not be properly introduced into the alloy structures 248 of the alloy feature 246. In some embodiments, if the pressure of the nitrogen-containing plasma is too high, such as higher than about 10 torr, the vacuum level of the reaction chamber where the semiconductor structure 202 is placed may be too low, leading to contamination in the chamber. In some embodiments, the nitrogen-containing plasma may be generated under an RF power ranging from about 30 W to about 1000 W, but other ranges of values are also within the scope of this disclosure. In some embodiments, if the PF power is too low, such as lower than about 30 W, the nitrogen-containing plasma may not be generated. In some embodiments, if the PF power is too high, such as higher than about 1000 W, the semiconductor structure 202 may be damaged. In some embodiments, a gas flow of a nitrogen-containing gas for generating the nitrogen-containing plasma may range from about 5 sccm and about 1000 sccm, but other ranges of values are also within the scope of this disclosure. In some embodiments if the gas flow is too small, such as smaller than about 5 sccm, the nitrogen-containing plasma may not be generated. In some embodiments, if the gas flow is too large, such as larger than about 1000 sccm, the vacuum level of the reaction chamber where the semiconductor structure 202 is placed may be too low, leading to contamination in the chamber.

Referring to FIG. 1, in a step 110 of the method 100, an alloy nitride feature is formed. Referring to FIGS. 10 to 13, in some embodiments, the nitrided structures 252 of the nitrided feature 250 may be subjected to a heating process, such as rapid thermal anneal (RTA), other suitable techniques, or any combination thereof, thereby forming the nitrided structures 252 of the nitrided feature 250 into a plurality of alloy nitride structures 258 of the alloy nitride feature 256. In some embodiments, each of the alloy nitride structures 258 of the alloy nitride feature 256 may include $M1_x(M2N)_y$, such as $Ru_x(TiN)_y$. In some embodiments, the alloy nitride structures 258 of the alloy nitride feature 256 may be crystalline or amorphous. In some embodiments, the heating process may be conducted under a protective gas, such as $N_2$, Ar, other suitable types of gas, or any combination thereof, with a gas flow ranging from about 5 sccm to about 1000 sccm but other ranges of values are also within the scope of this disclosure, and with a pressure ranging from about 0.05 torr to about 10 torr but other ranges of values are also within the scope of this disclosure. In some embodiments, if the gas flow of the protective gas is too small, such as smaller than about 5 sccm, the protective gas may not be able to protect the nitrided feature 250 and/or alloy nitride feature 256, such as from oxidation, during the heating process. In some embodiments, if the gas flow of the protective gas is too large, such as greater than about 1000 sccm, the vacuum level of the reaction chamber where the semiconductor structure 202 is placed may be too low, leading to contamination in the chamber. In some embodiments, if the pressure is too low, such as lower than about 0.05 torr, the protective gas may not be able to protect the nitrided feature 250 and/or alloy nitride feature 256 such as from oxidation, during the heating process. In some embodiments, if the pressure is too high, such as higher than about 10 torr, the vacuum level of the reaction chamber where the semiconductor structure 202 is placed may be too low, leading to contamination in the chamber. In some embodiments, the heating process may be conducted under a temperature ranging from about 100° C. to about 200° C., but other ranges of values are also within the scope of this disclosure. In some embodiments, if the heating temperature is too low, such as lower than about 100° C., the nitrided feature 250 may not be turned into the alloy nitride feature 256. In some embodiments, if the heating temperature is too high, such as higher than about 200° C., the semiconductor structure 202 may be negatively affected or damaged. In some embodiments, the time of heating may range from about 10 seconds to about 20 seconds, but other ranges of values are also within the scope of this disclosure. In some embodiments, if the heating time is too short, such as shorter than about 10 seconds, the nitrided feature 250 may not be turned into the alloy nitride feature 256. In some embodiments, if the heating time is too long, such as longer than about 20 seconds, the semiconductor structure 202 may be negatively affected or damaged. In some embodiments, the amount of M1 in each of the alloy nitride structures 258 of the alloy nitride feature 256 may range from about 25% to about 35% (e.g., may be in weight percent) but other ranges of values are also within the scope of this disclosure, and the amount of M2 in each of the alloy nitride structures 258 of the alloy nitride feature 256 may range from about 20% to about 30% (e.g., may be in weight percent) but other ranges of values are also within the scope of this disclosure. In some embodiments, if the amount of M1 in each of the alloy nitride structures 258 of the alloy nitride feature 256 is too large, such as greater than about 35%, the amount of M2 may be too small, leading to poor adhesion of the alloy nitride structures 258 of the alloy nitride feature 256 to the second dielectric feature 232. In some embodiments, if the amount of M1 in each of the alloy nitride structures 258 of the alloy nitride feature 256 is too small, such as smaller than about 25%, the resistance of the alloy nitride structures 258 of the alloy nitride feature 256 may be increased. In some embodiments, if the amount of M2 in each of the alloy nitride structures 258 of the alloy nitride feature 256 is too large, such as greater than about 30%, the amount of M1 may be too small, leading to increased resistance of the alloy nitride structures 258 of the alloy nitride feature 256. In some embodiments, if the amount of M2 in each of the alloy nitride structures 258 of the alloy nitride feature 256 is too small, such as smaller than about 20%, the adhesion of the alloy nitride structures 258 of the alloy nitride feature 256 to the second dielectric feature 232 may be deteriorated.

Figure 14:
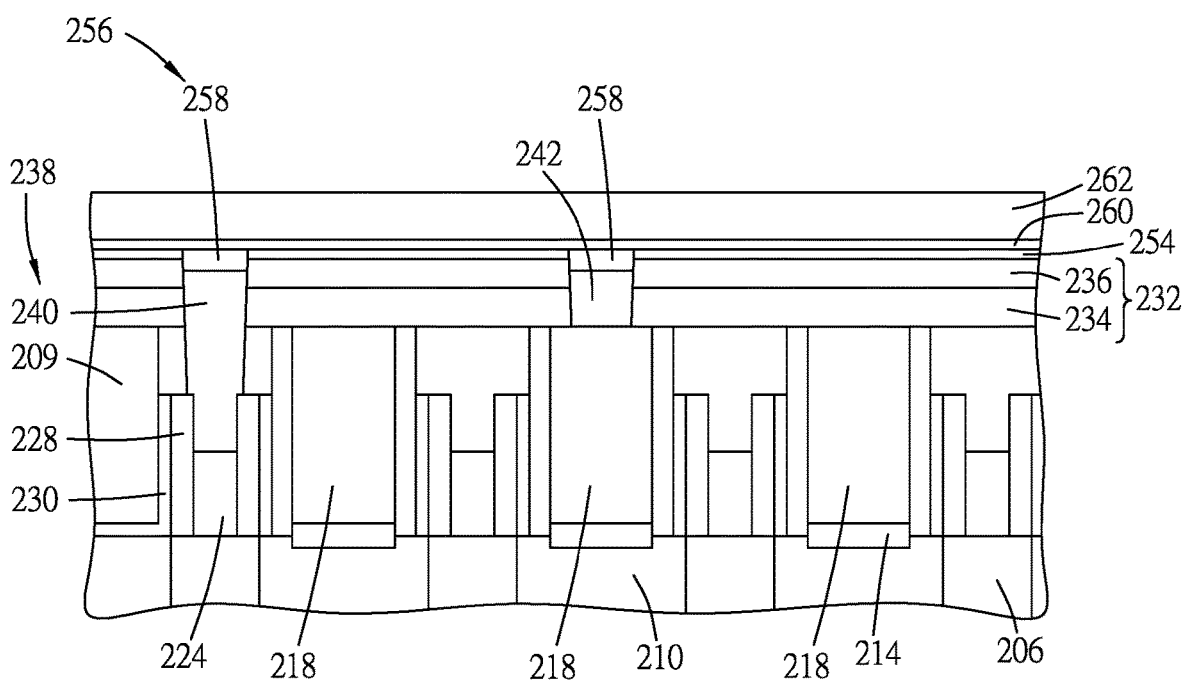
Figure 15:
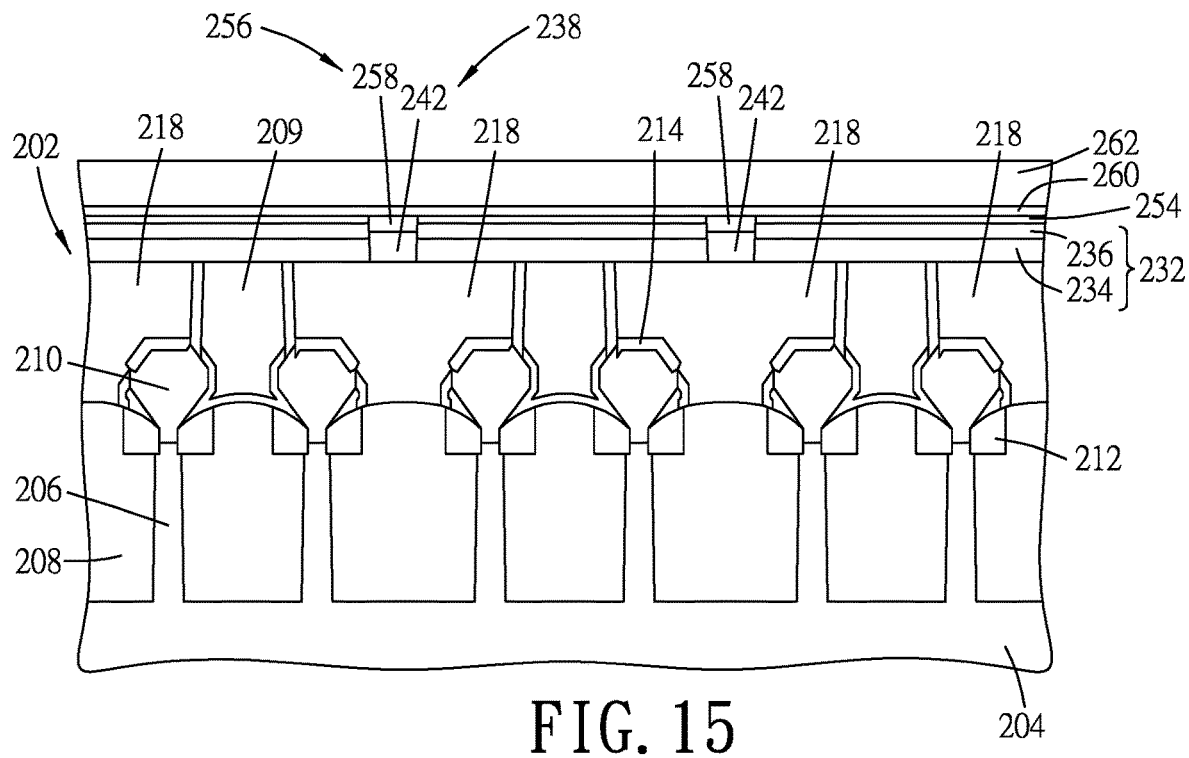
Figure 16:
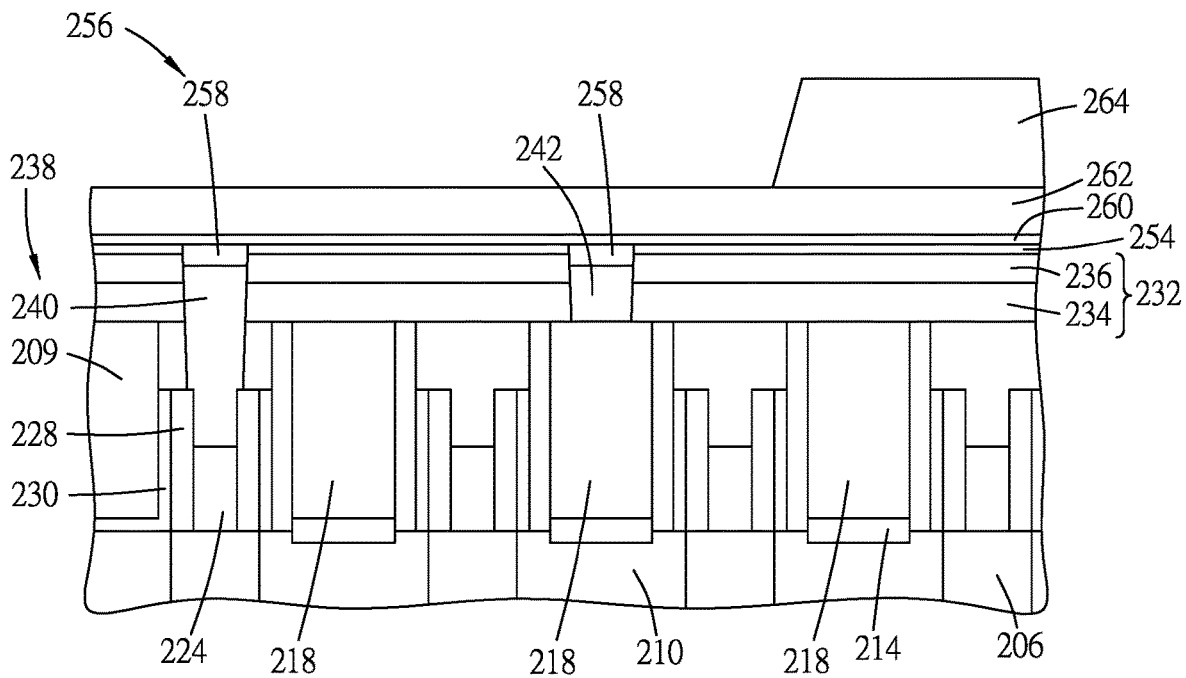
Figure 17:
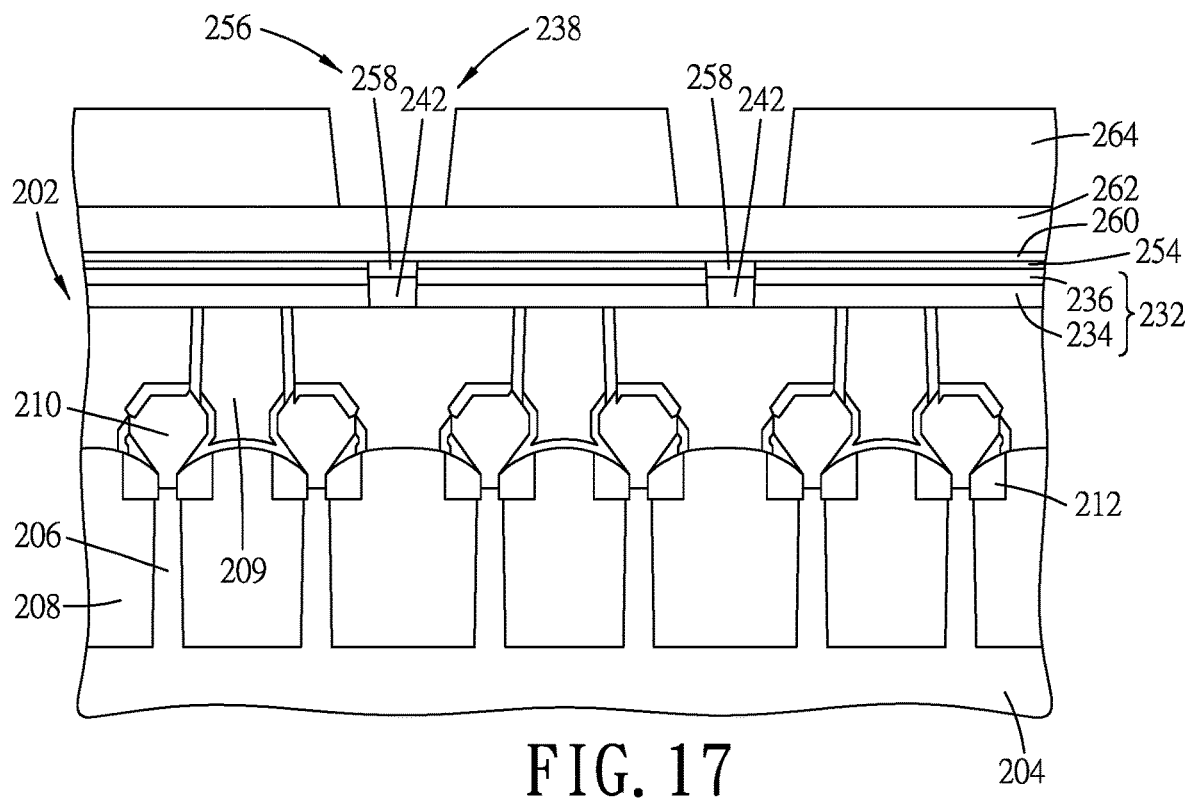
Figure 18:
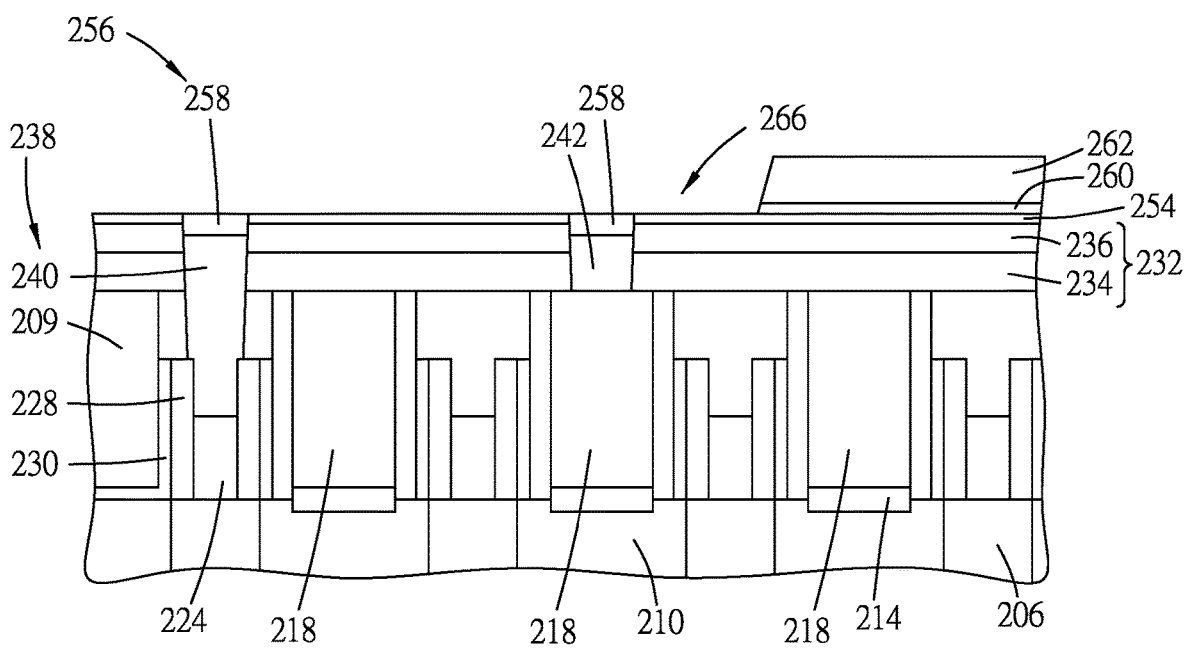
Figure 19:
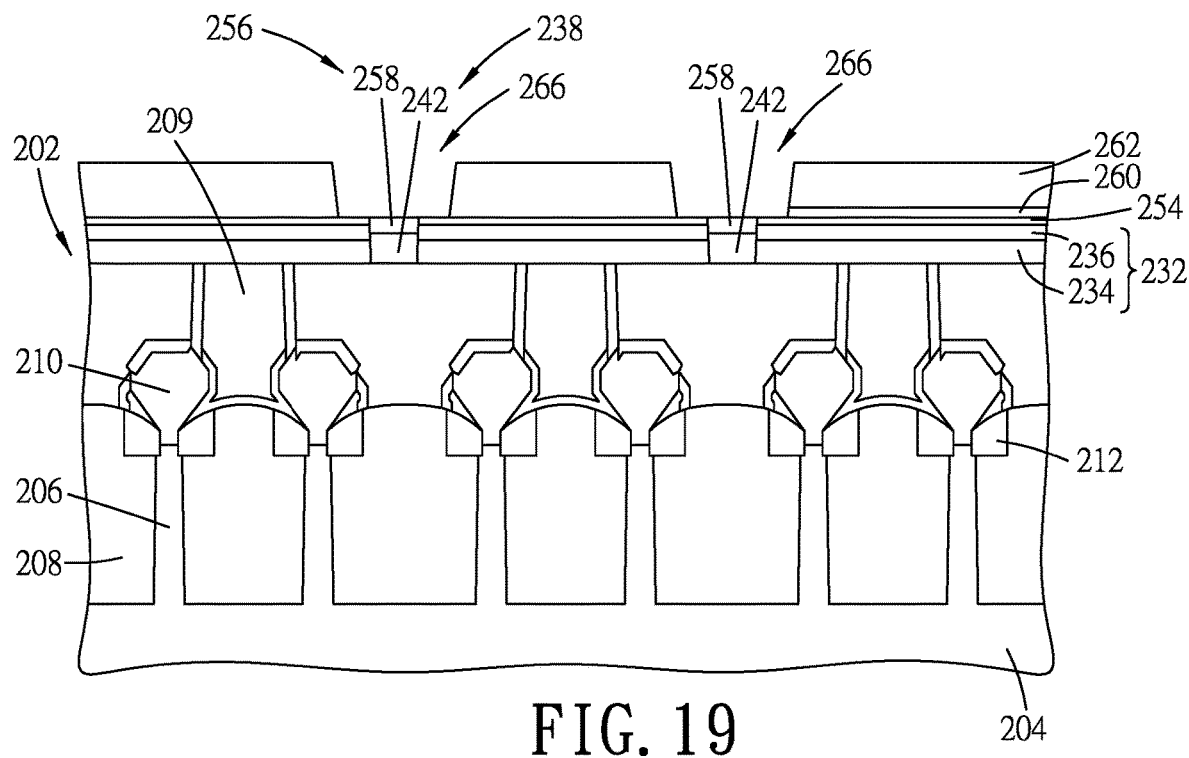
Figure 20:
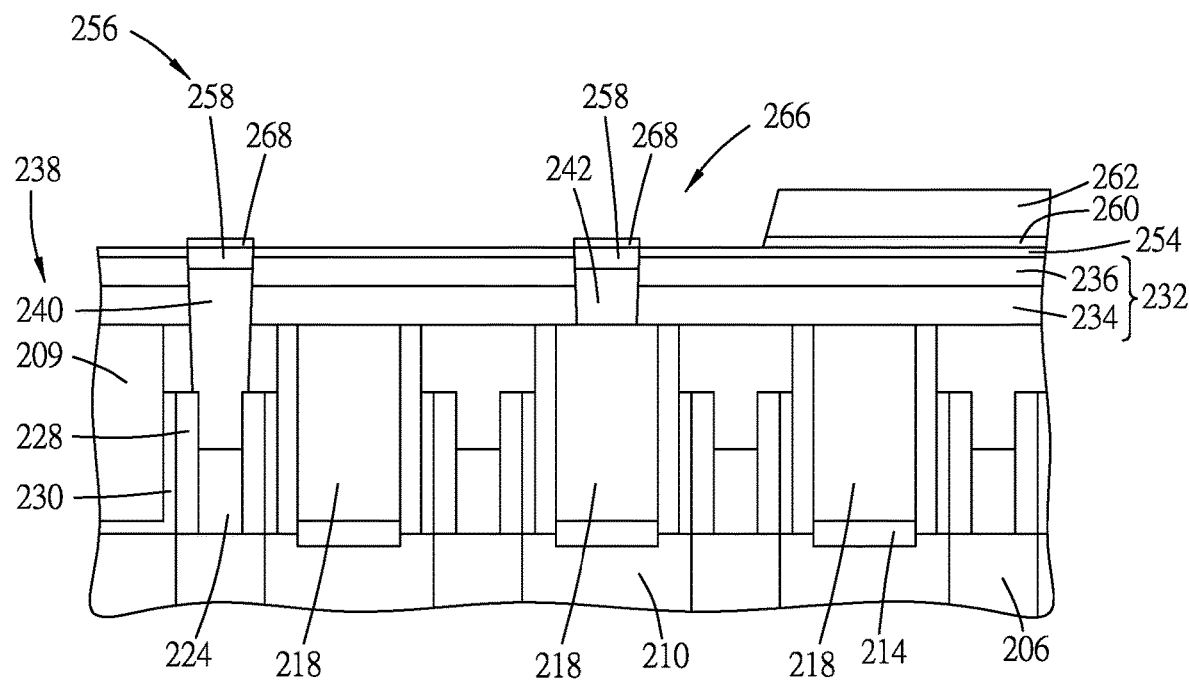
Figure 21:
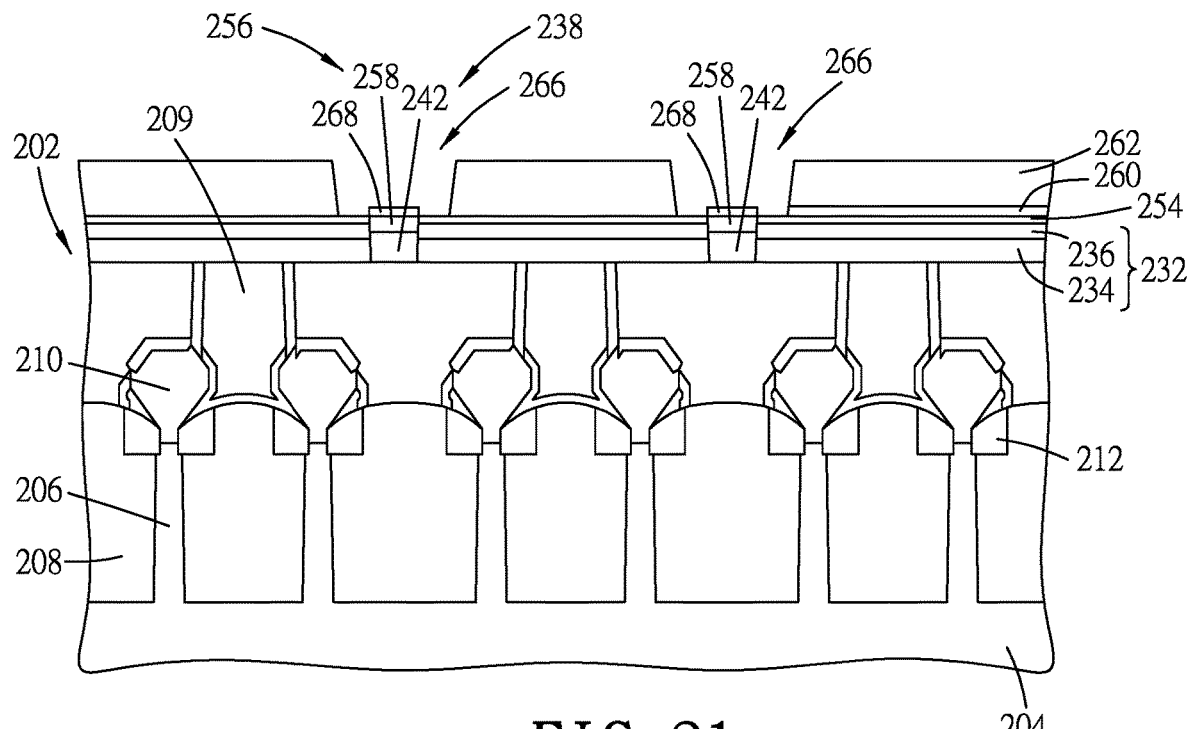

Referring to FIG. 1, in a step 112 of the method 100, a conductive line feature is formed. Referring to FIGS. 14 and 15, in some embodiments, an etch stop layer (ESL) 260 is formed over the second dielectric feature 232, followed by forming a third dielectric feature 262 over the ESL 260. In some embodiments, the ESL 260 may include an oxide-based material (e.g., silicon oxide), a nitride-based material (e.g., silicon nitride), a carbide-based material (e.g., silicon carbide), other suitable materials, or any combination thereof. In some embodiments, the third dielectric feature 262 may include LaO, AlO, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other suitable materials, or any combination thereof. Then, referring to FIGS. 16 and 17, a mask layer 264 is formed over the third dielectric feature 262. Afterwards, referring further to FIGS. 18 and 19, the mask layer 264 is used as a mask for etching the third dielectric feature 262 to form a plurality of trenches 266 in the third dielectric feature 262, where the alloy nitride structures 258 of the alloy nitride feature 256 are exposed from the trenches 266.

Figure 22:
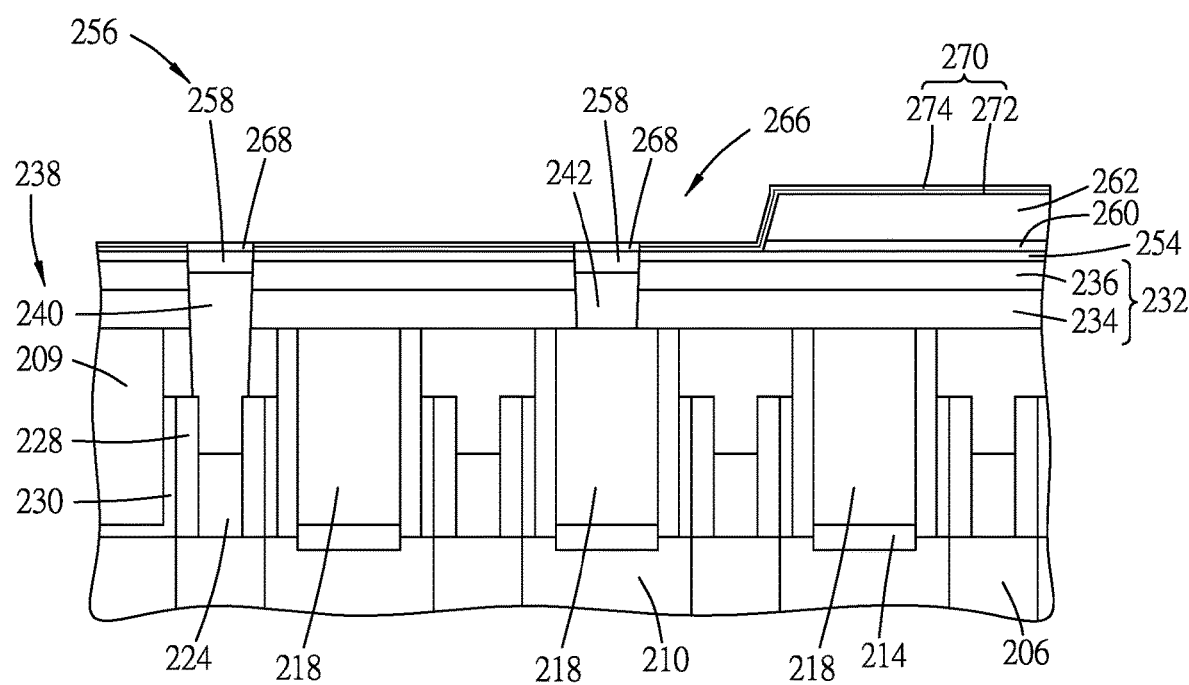
Figure 23:
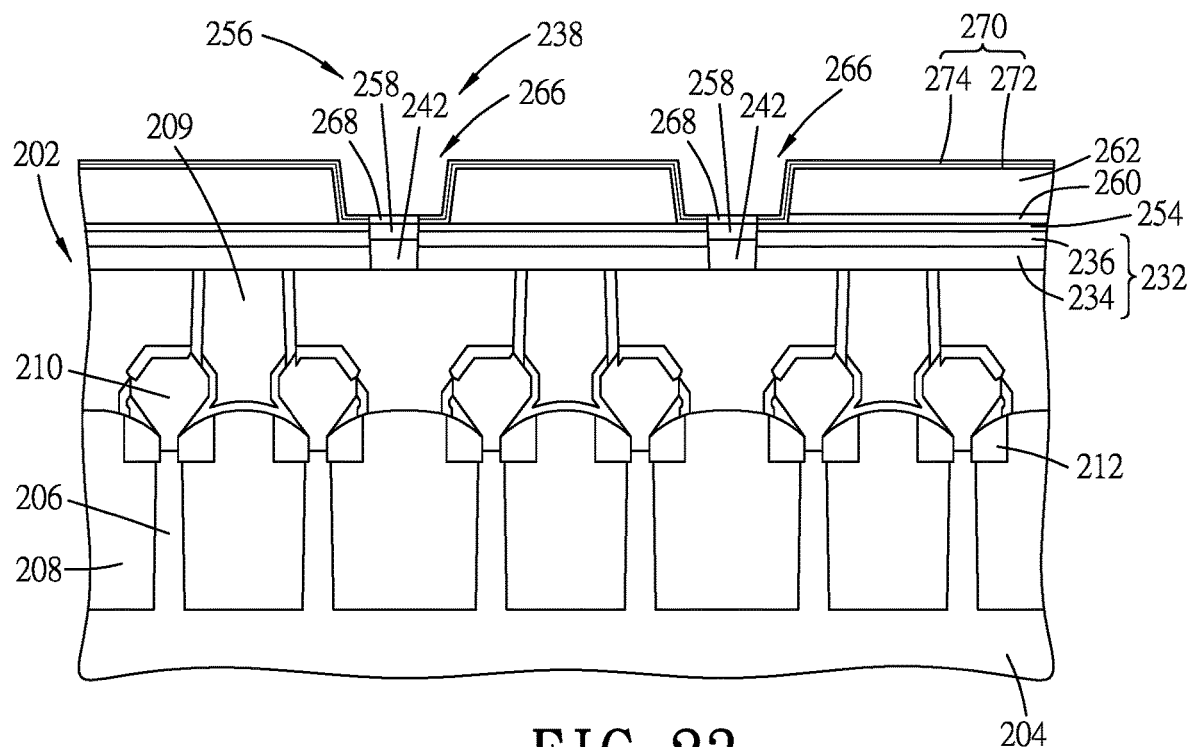
Figure 24:
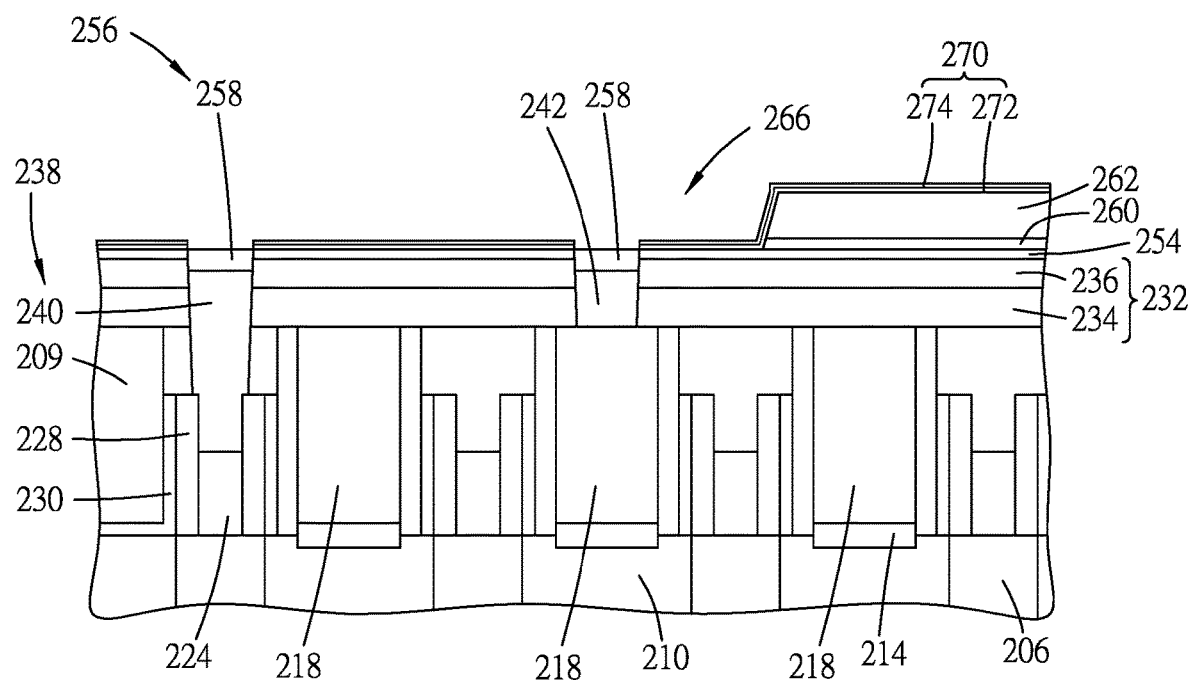
Figure 25:
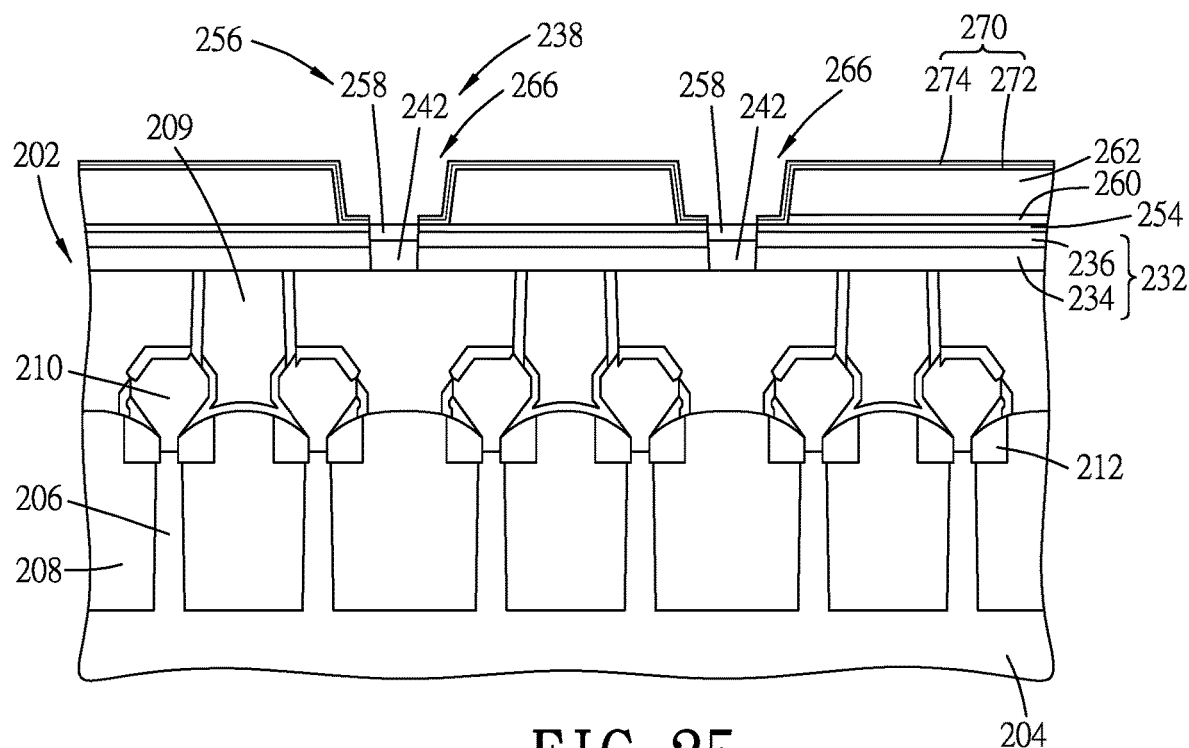

Referring to FIGS. 24 to 25, in some embodiments, a barrier layer feature 270 may be selectively formed over the second dielectric feature 232 and the third dielectric feature 262, in the trenches 266, and outside of the alloy nitride structures 258 of the alloy nitride feature 256. Such feature may be achieved by, referring to FIGS. 20 and 21, selectively forming a plurality of blocking layers 268 over the alloy nitride structures 258 of the alloy nitride feature 256, outside of the second dielectric feature 232, the nitrided layer 254, and the third dielectric feature 262. In some embodiments, the blocking layers 268 may include a plurality of self-assembled monolayer (SAM) molecules each including a head group that can be selectively bonded to the alloy nitride structures 258 of the alloy nitride feature 256, a functional group, and a tail that is connected between the head group and the functional group. In some embodiments, the head groups of the SAM molecules may contain phosphorus (P), sulfur (S), nitrogen (N), other suitable materials, or any combination thereof. Examples of SAM may include alkanethiol, dialkyl disulfide, dialkyl sulfide, carboxylic acid, nitrile, etc. Then, referring to FIGS. 22 and 23, in some embodiments, the barrier layer feature 270 is selectively formed over the second dielectric feature 232 and the third dielectric feature 262, in the trenches 266, and outside of the blocking layers 268. In some embodiments, the barrier layer feature 270 may be formed by ALD, CVD, PVD, other suitable techniques, or any combination thereof. In some embodiments, the functional groups of the SAM molecules may be hydrophobic to repulse a precursor for forming the barrier layer feature 270, and the barrier feature 270 is therefore formed outside of the blocking layers 268. In some embodiments, the functional groups may have low reactivity to the precursor for forming the barrier layer feature 270. Examples of the functional groups may be alkyl group, benzyl group, etc. In some embodiments, the barrier layer feature 270 may include TiN, TaN, Ru, Co, W, Mo, other suitable materials, or any combination thereof. In some embodiments, the barrier layer feature 270 may be multi-layered. For example, in some embodiments, the barrier layer feature 270 may include a first barrier layer 272 and a second barrier layer 274. Then, referring to FIGS. 24 and 25, in some embodiments, the blocking layers 268 shown in FIGS. 22 and 23 are removed. In some embodiments, the blocking layers 268 may be removed by plasma dry etching, chemical wet etching (e.g., using high temperature sulfuric acid and hydrogen peroxide mixture (SPM), SC1 solution, SC2 solution (HCl//$H_2O_2$/$H_2O$), diluted HF, diluted HCl, diluted $NH_4OH$, diluted $H_2O_2$, $H_3PO_4$, etc.), ashing, other suitable techniques, or any combination thereof. Then, referring to FIGS. 26 and 27, in some embodiments, a filling conductive material 278 may be formed over the barrier layer feature 270 and in the trenches 266 (see FIGS. 24 and 25). In some embodiments, the filling conductive material 278 may include Cu, Co, Ru, other suitable materials, or any combination thereof. In some embodiments, prior to forming the filling conductive material 278, a seed layer 284 may be formed over the barrier layer feature 270 and in the trenches 266. In some embodiments, the seed layer 284 may include Co, Ru, W, Mo, other suitable materials, or any combination thereof. Then, referring to FIGS. 26 to 29, in some embodiments, top portions of the filling conductive material 278 and the barrier layer feature 270 are removed by chemical mechanical planarization (CMP), dry etching, other suitable techniques, or any combination thereof, thereby obtaining the conductive line feature 280 that is electrically connected to the contact feature 238 via the alloy nitride feature 256, where the conductive line feature 280 includes a plurality of conductive lines 282 each being surrounded by a barrier layer structure 276 that is a portion of the barrier layer feature 270. The semiconductor device 200 is thus obtained.

Figure 26:
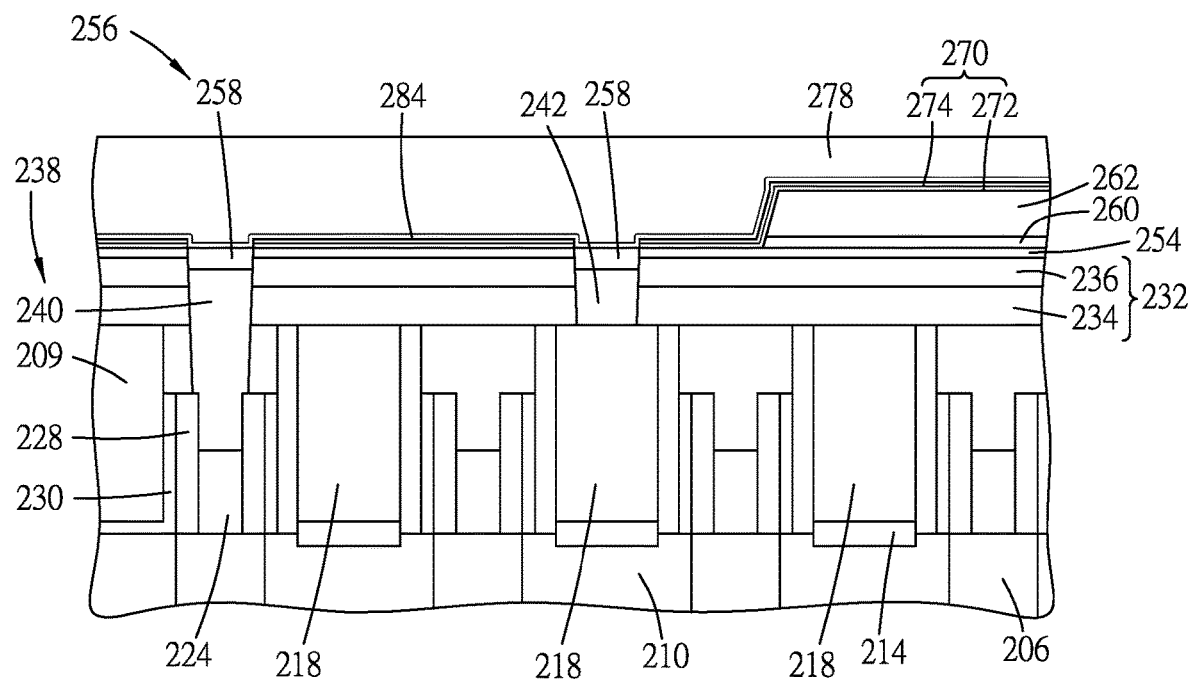
Figure 27:
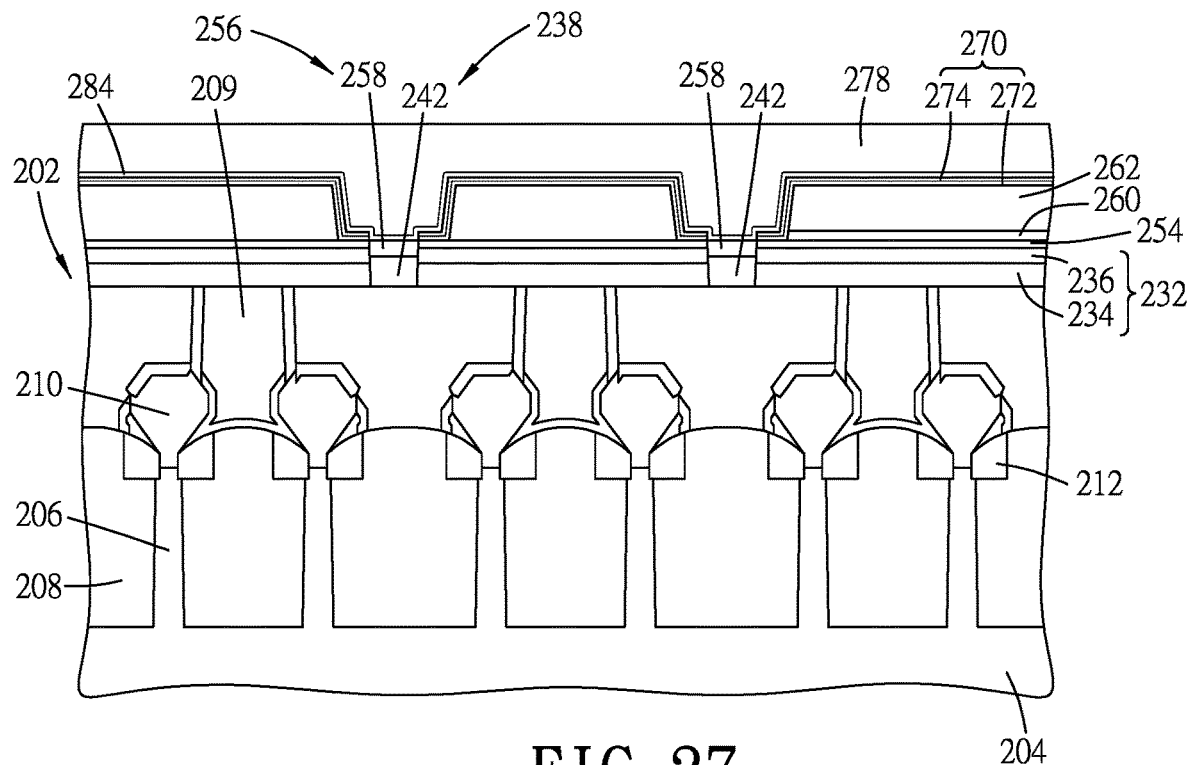
Figure 28:
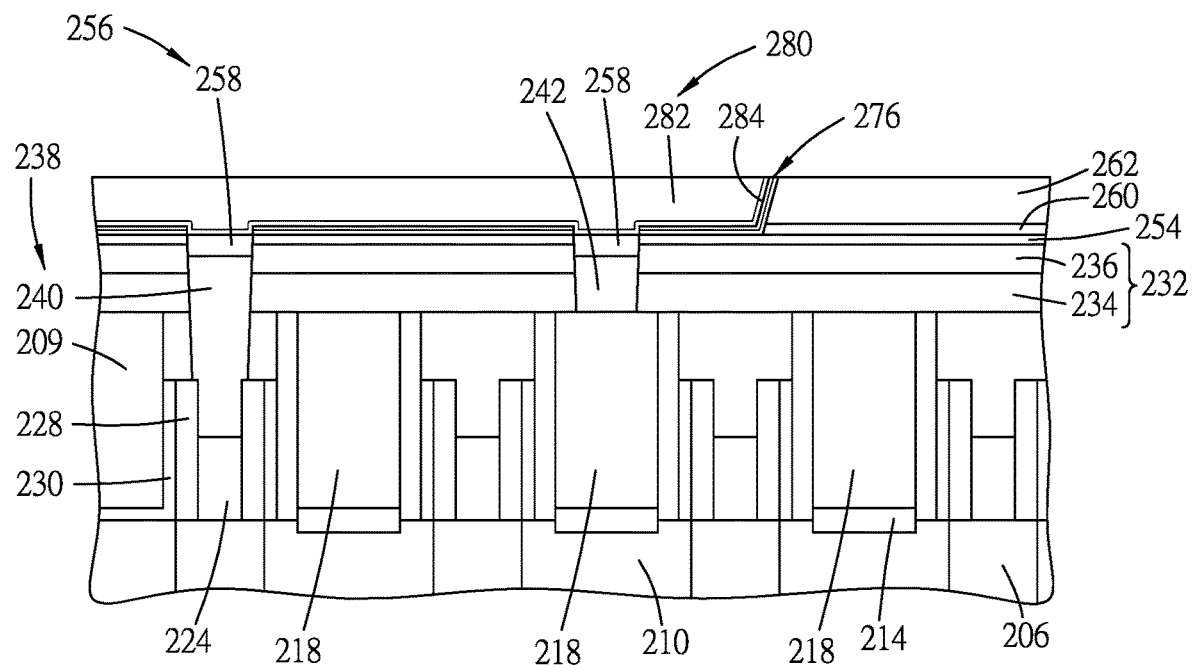
Figure 29:
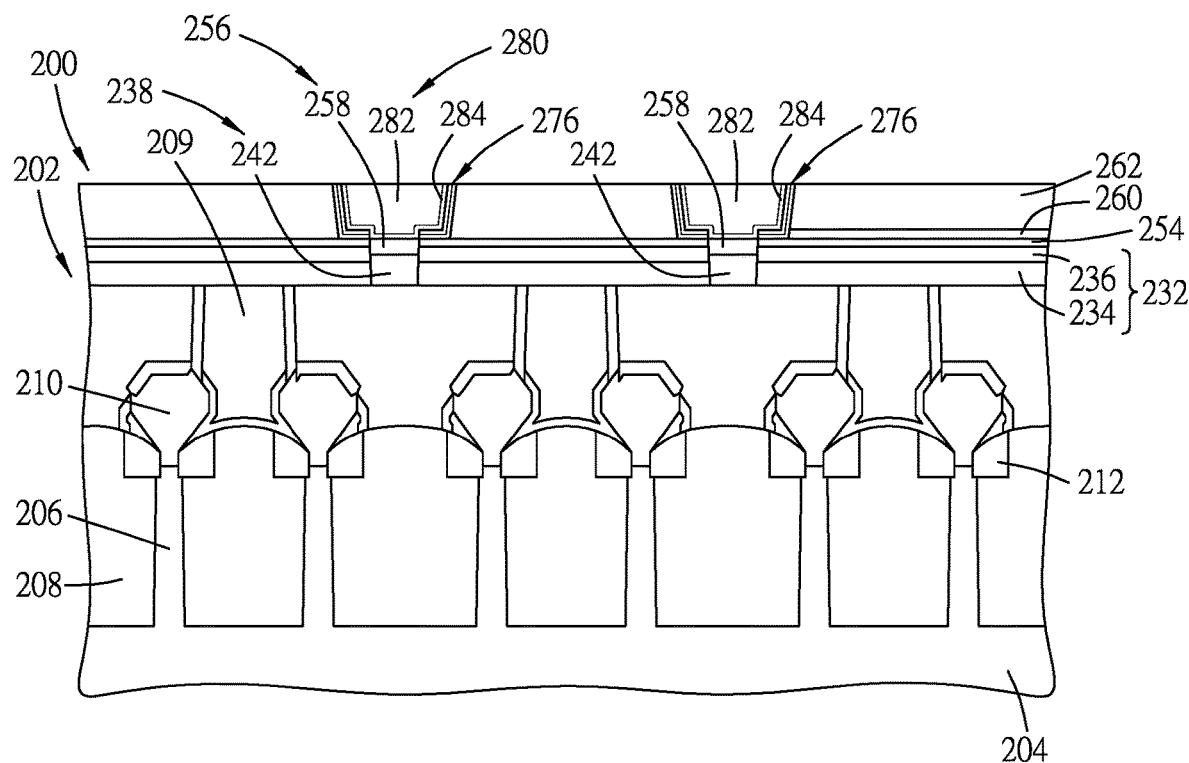

Referring to FIGS. 28 and 29, in some embodiments, each of the alloy nitride structures 258 of the alloy nitride feature 256 may have a thickness ranging from about 0.5 nm to about 4 nm, but other ranges of values are also within the scope of this disclosure. The alloy nitride structures 258 of the alloy nitride feature 256 may block metals from diffusing out of the conductive lines 282 of the conductive line feature 280 into the semiconductor structure 202 (i.e., outward-diffusion of the metals from the conductive lines 282 of the conductive line feature 280). In some embodiments, if the thickness of each of the alloy nitride structures 258 of the alloy nitride feature 256 is too small, such as smaller than about 0.5 nm, the alloy nitride structures 258 of the alloy nitride feature 256 may not effectively block the outward-diffusion of the metals from the conductive lines 282 of the conductive line feature 280. In some embodiments, if the thickness of each of the alloy nitride structures 258 of the alloy nitride feature 256 is too large, such as greater than about 4 nm, the resistance between the conductive line feature 280 and the contact feature 238 may be too large. Referring to FIGS. 26 and 27, in some embodiments, each of the first barrier layer 272 and the second barrier layer 274 of the barrier layer feature 270 may have a thickness ranging from about 0.5 nm to about 10 nm, but other ranges of values are also within the scope of this disclosure. In some embodiments, if the thickness of each of the first barrier layer 272 and the second barrier layer 274 of the barrier layer feature 270 is too small, such as smaller than about 0.5 nm, the outward-diffusion of the metals from the conductive lines 282 of the conductive line feature 280 may not be prevented. In some embodiments, if the thickness of each of the first barrier layer 272 and the second barrier layer 274 of the barrier layer feature 270 is too large, such as greater than about 10 nm, the resistance of the barrier layer feature 270 may be too large. Referring to FIGS. 26 and 27, in some embodiments, the seed layer 284 may have a thickness ranging from about 0.5 nm to about 10 nm, but other ranges of values are also within the scope of this disclosure. In some embodiments, if the thickness of the seed layer 284 is too small, such as smaller than about 0.5 nm, the filling conductive material 278 may not be properly formed over the seed layer 284. In some embodiments, if the thickness of the seed layer 284 is too large, such as larger than about 10 nm, the resistance of the seed layer 284 may be too large. Referring to FIGS. 28 and 29, in some embodiments, each of the conductive lines 282 of the conductive line feature 280 has a thickness ranging from about 2 nm to about 20 nm, but other ranges of values are also within the scope of this disclosure. In some embodiments, if the thickness of each of the conductive lines 282 of the conductive line feature 280 is too small, such as smaller than about 2 nm, the resistance of each of the conductive lines 282 of the conductive line feature 280 may be too large. In some embodiments, the thickness of each of the conductive lines 282 of the conductive line feature 280 may be greater than about 20 nm, according to practical requirements. Referring to FIGS. 28 and 29, in some embodiments, the third dielectric feature 262 may have a thickness that is similar to the thickness of each of the conductive lines 282 of the conductive line feature 280, such as a thickness ranging from about 2 nm to about 20 nm but other ranges of values are also within the scope of this disclosure.

Figure 30:
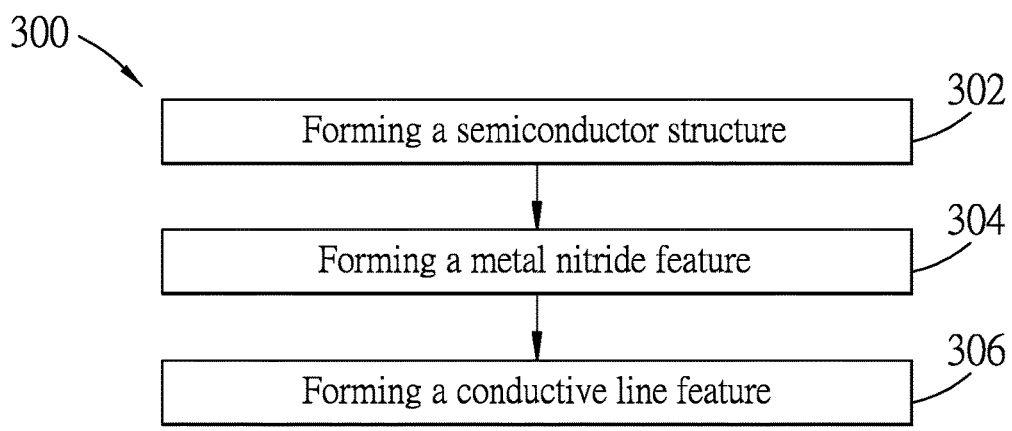
FIG. 30 illustrates a method of making a semiconductor device in accordance with some embodiments.
Figure 31:
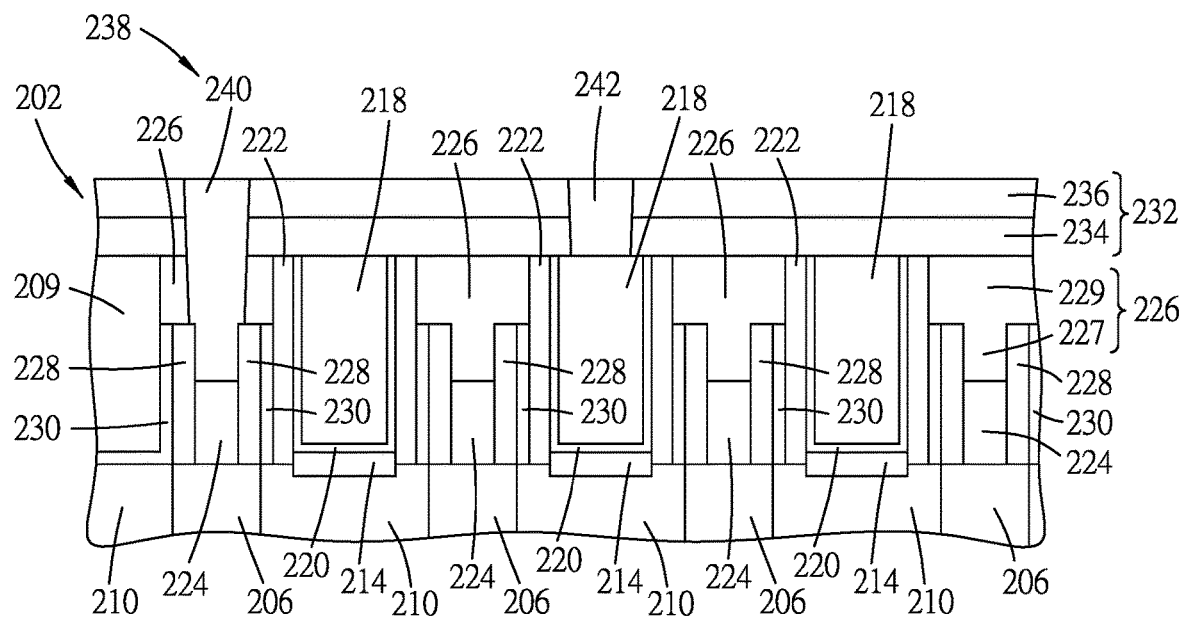
FIGS. 31 to 48 illustrates a method of making a semiconductor device in accordance with some embodiments.

FIG. 30 illustrates another method 300 of making the semiconductor device 200 (see FIGS. 47 and 48) in accordance with some embodiments. FIGS. 31 to 48 are schematic views showing intermediate stages of the method 300 as depicted in FIG. 31, where FIGS. 31, 33, 35, 37, 39, 41, 43, 45, and 47 are schematic views taken from the semiconductor device 200 along a direction parallel to the fins 206 (see FIG. 32) of the semiconductor device 200, and where FIGS. 32, 34, 36, 38, 40, 42, 44, 46, and 48 are schematic views taken from the semiconductor device 200 along a direction perpendicular to the fins 206. Additional steps which are not limited to those described in the method 300, can be provided before, after or during certain step, and some of the steps described herein may be replaced by other steps or be eliminated. Similarly, additional features may be present, and/or features present may be replaced or eliminated in additional embodiments.

Figure 32:
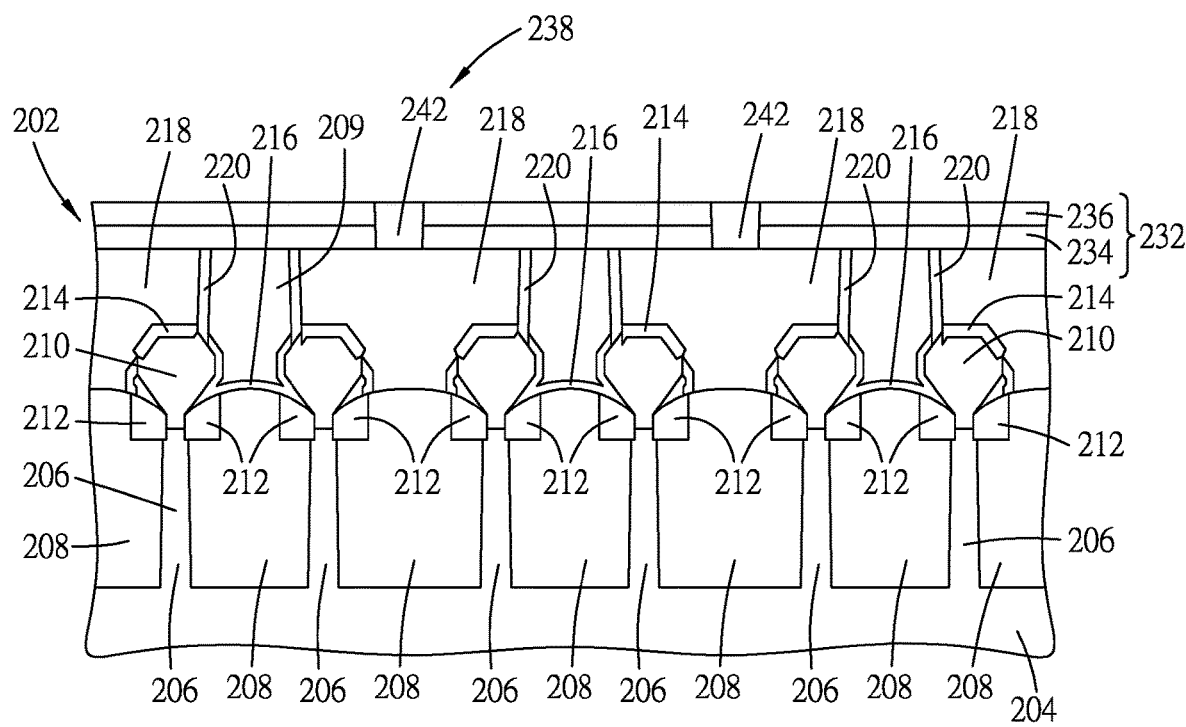

Referring to FIGS. 30 to 32, in a step 302 of the method 300, the semiconductor structure 202 is formed. Details of the semiconductor structure 202 are described hereabove, and are therefore not repeated for the sake of brevity.

Figure 33:
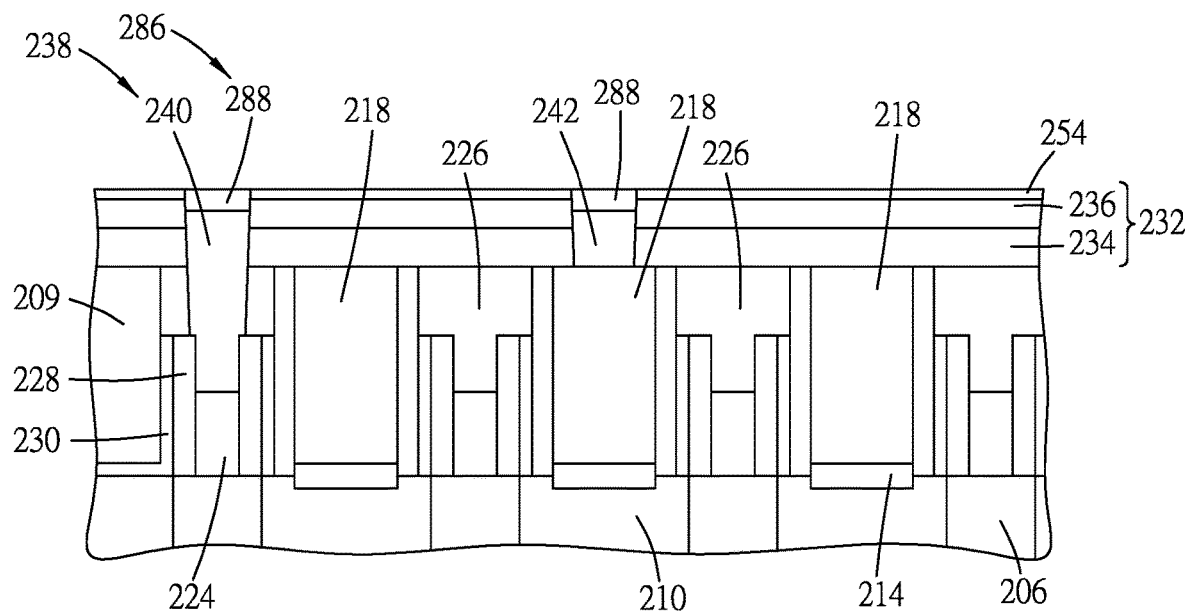
Figure 34:
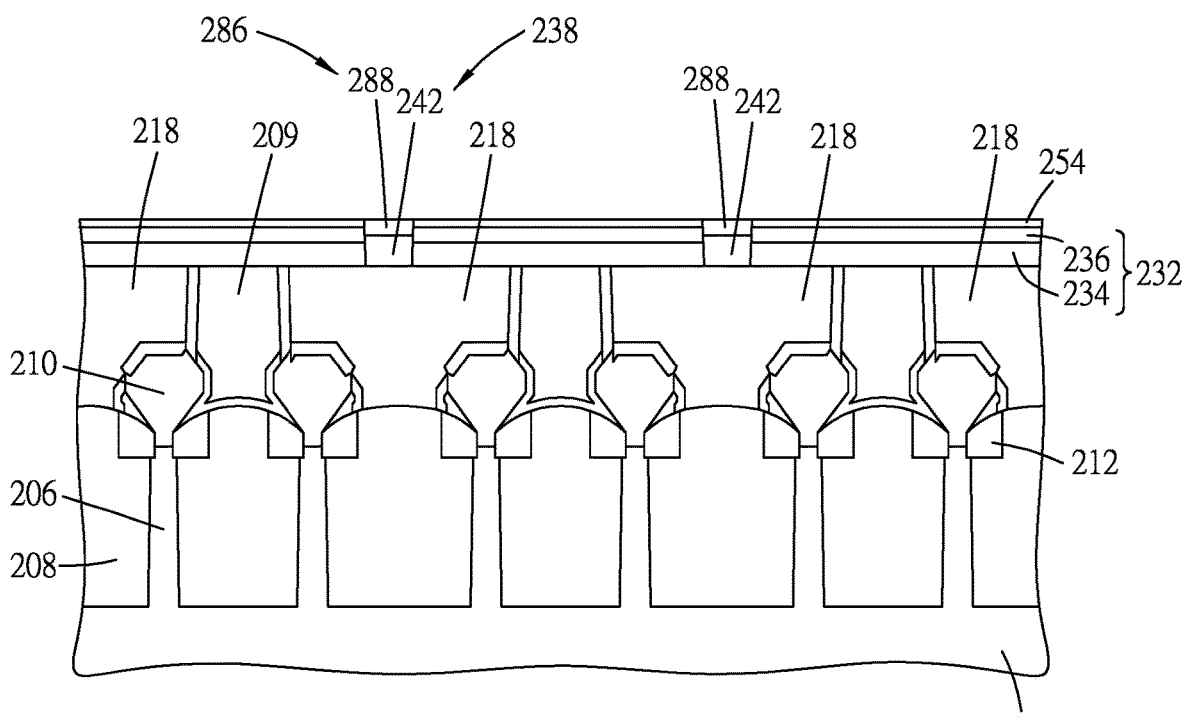
Figure 35:
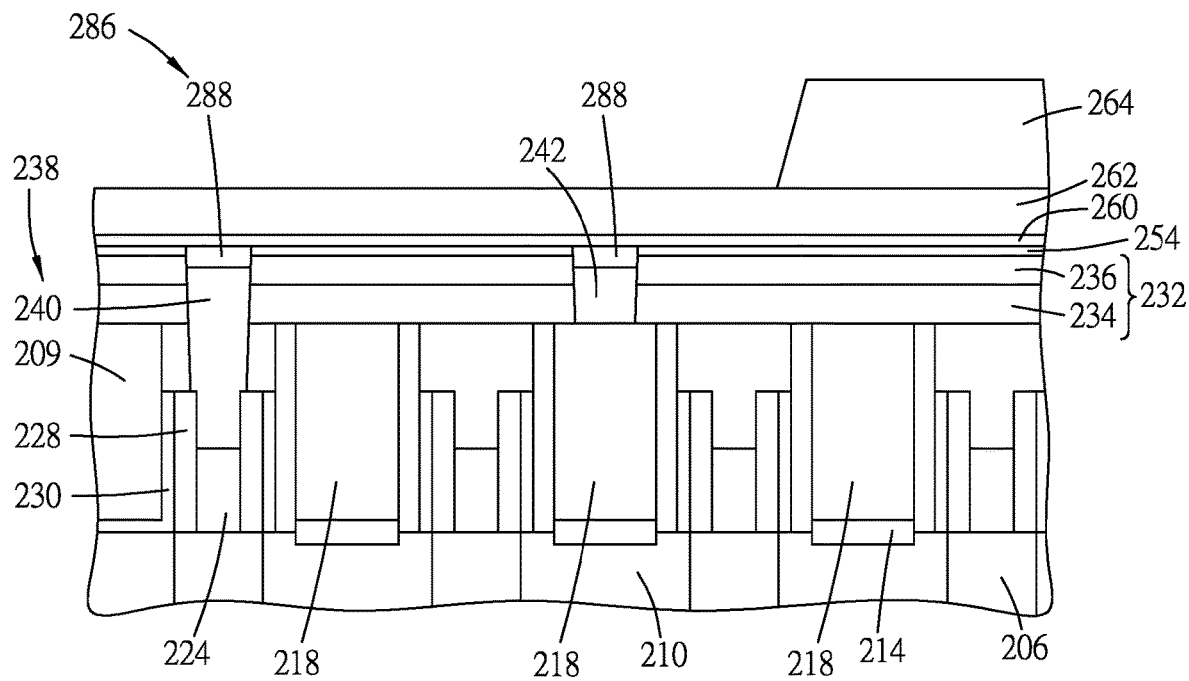
Figure 36:
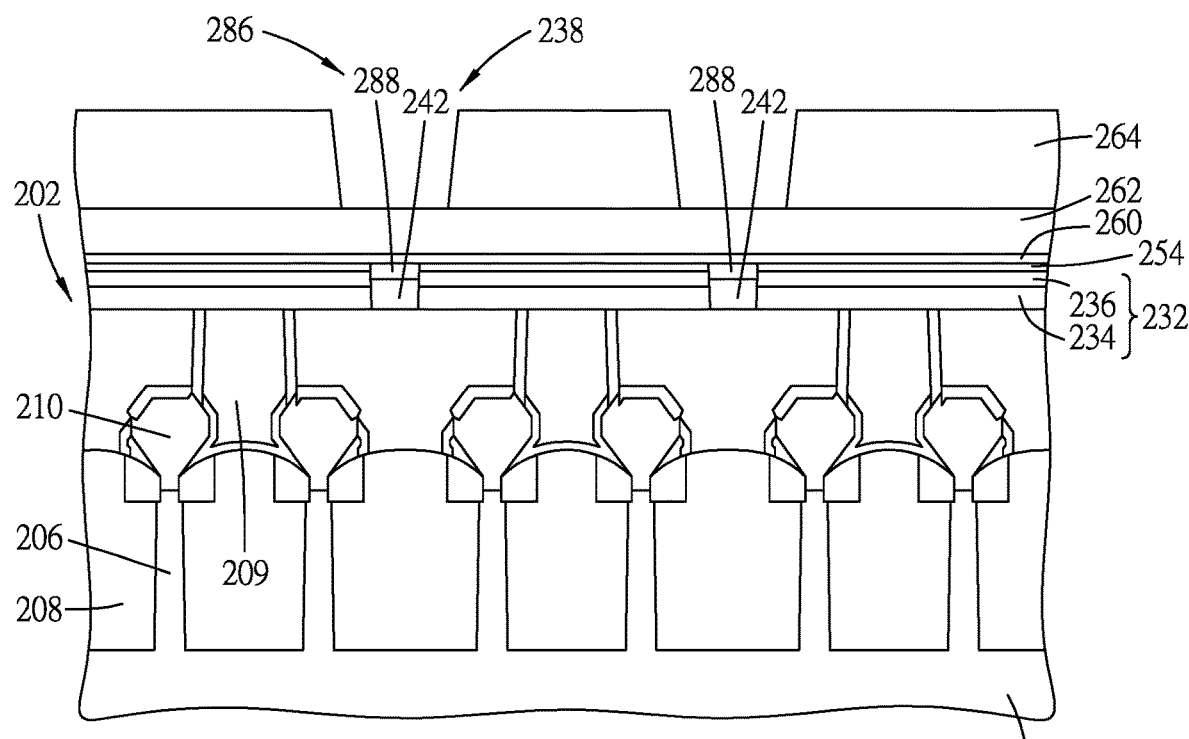
Figure 37:
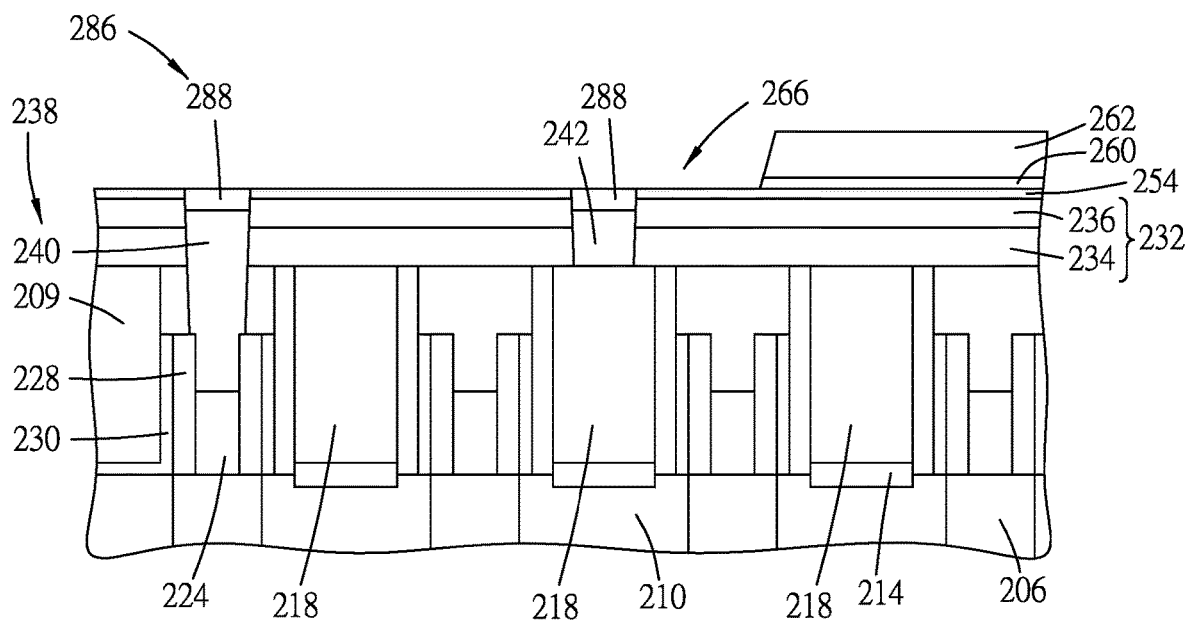
Figure 38:
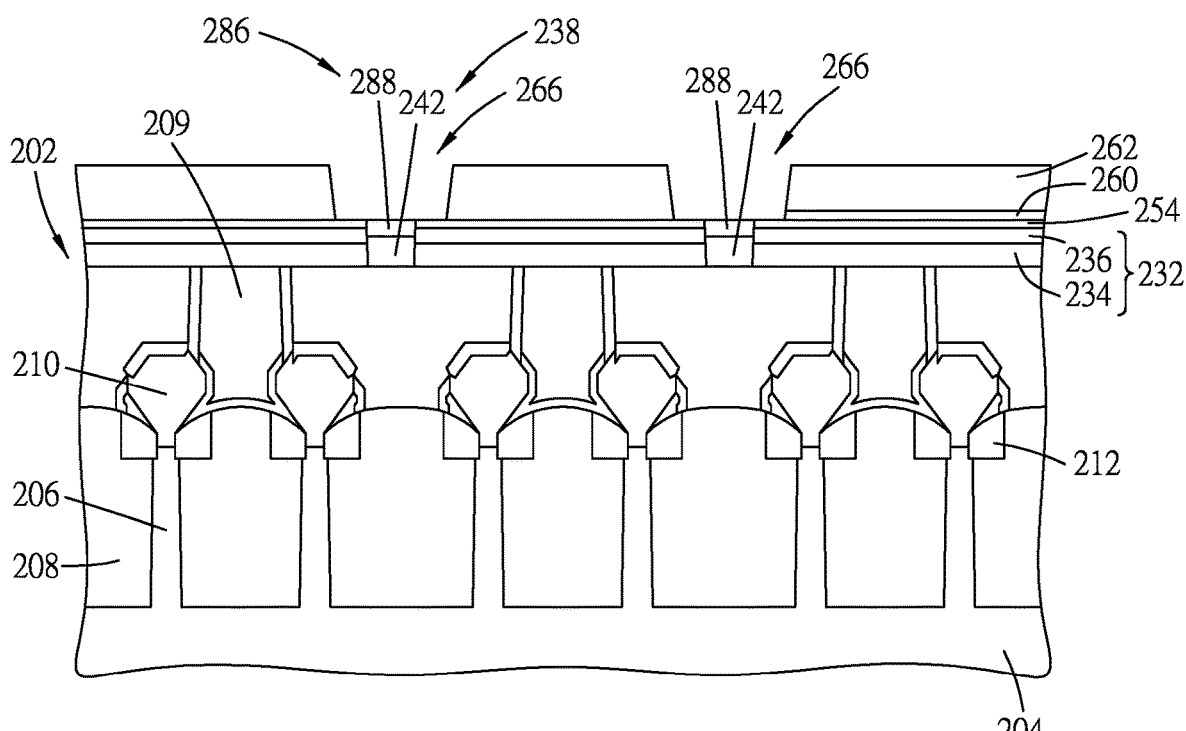
Figure 39:
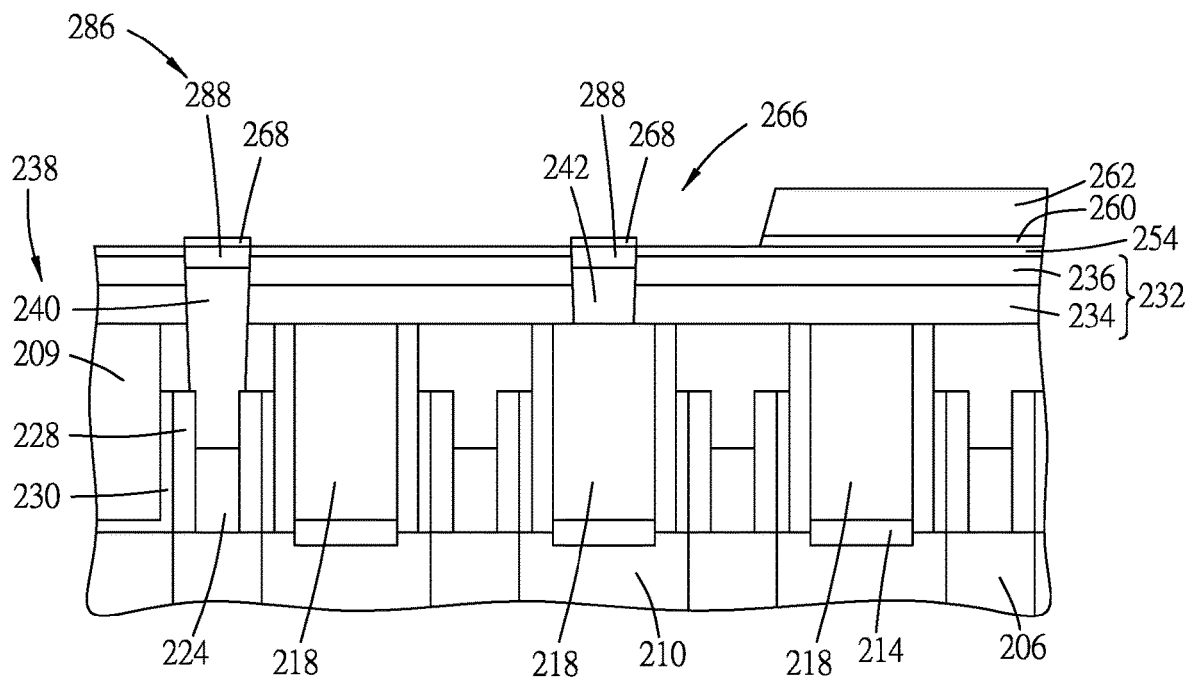
Figure 40:
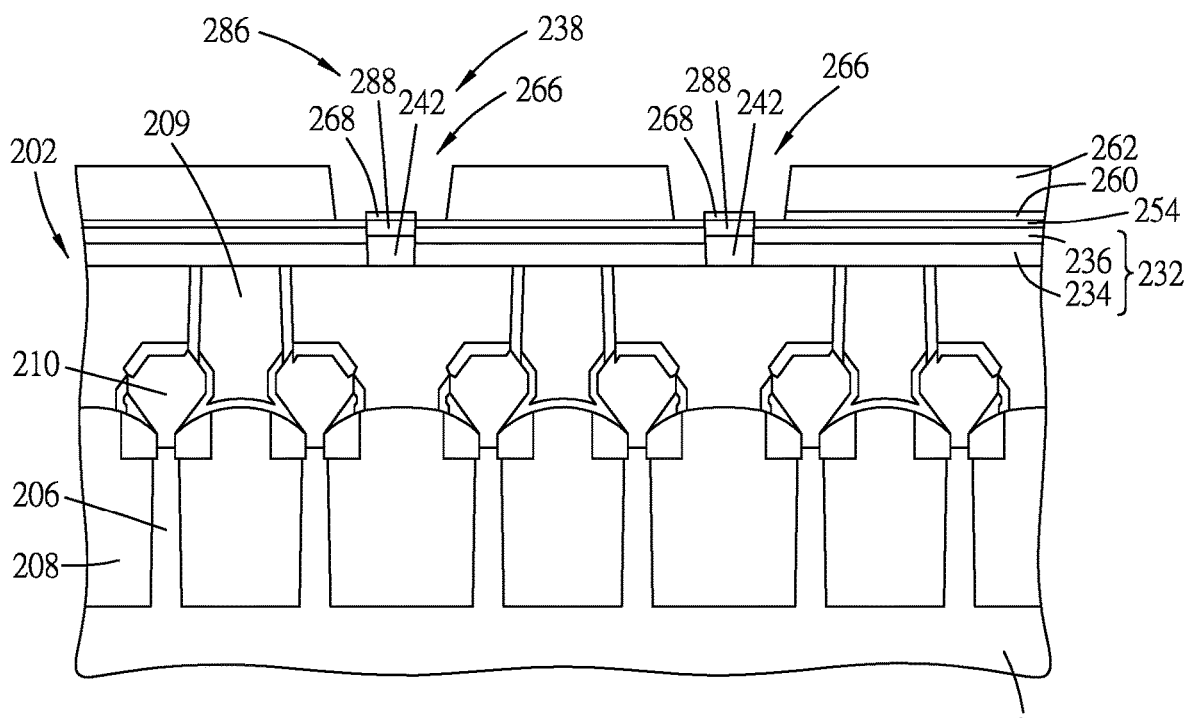
Figure 41:
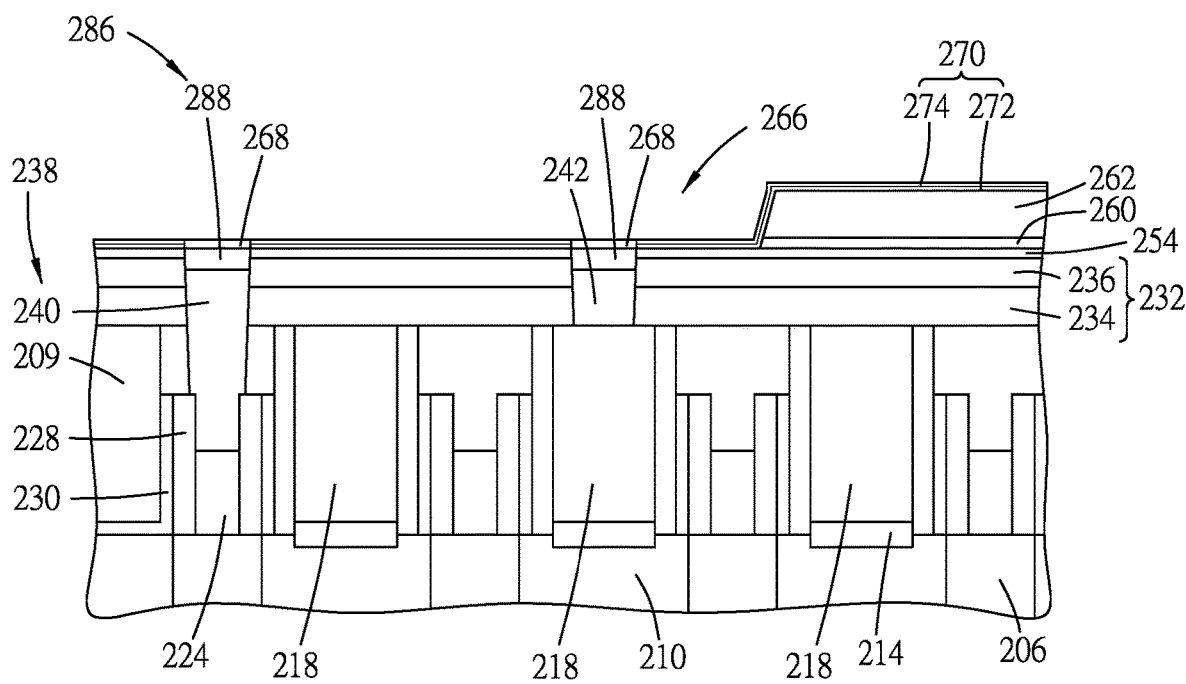
Figure 42:
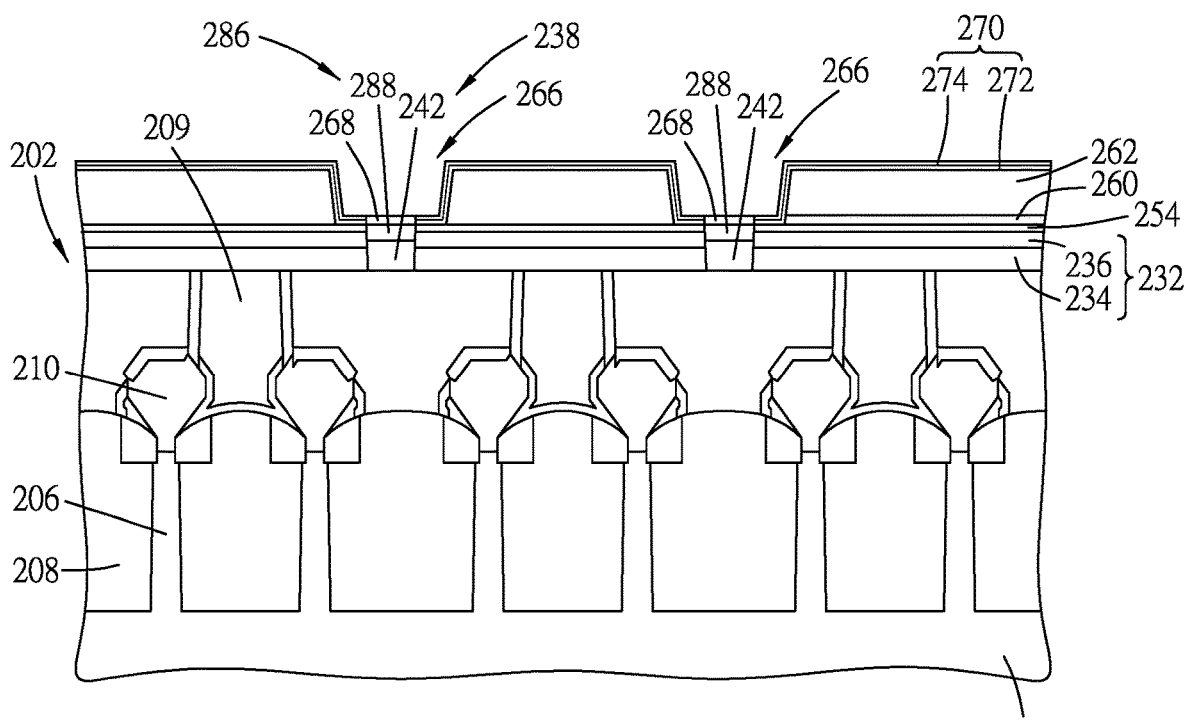
Figure 43:
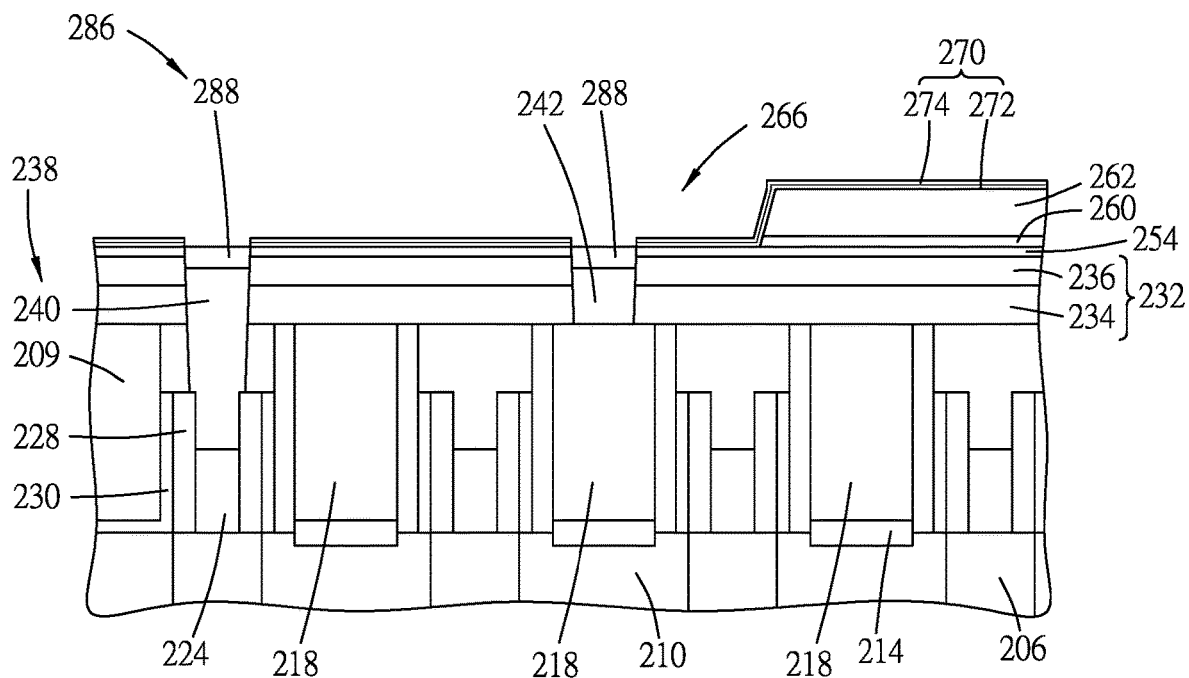
Figure 44:
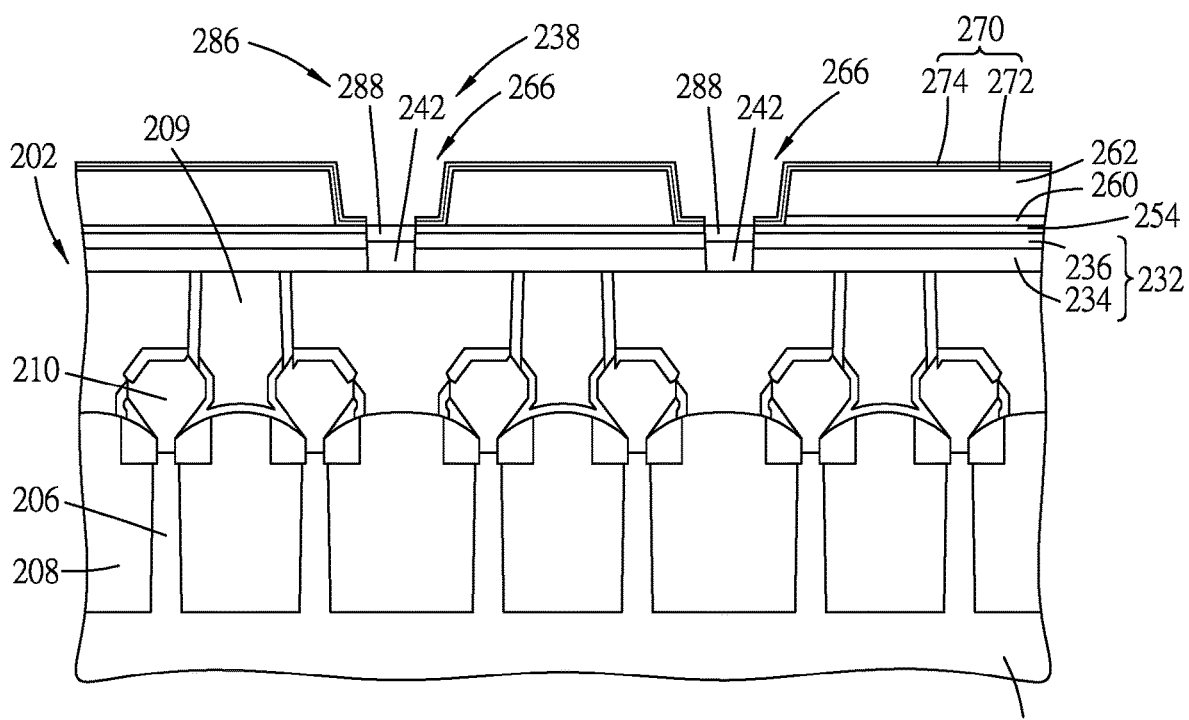
Figure 45:
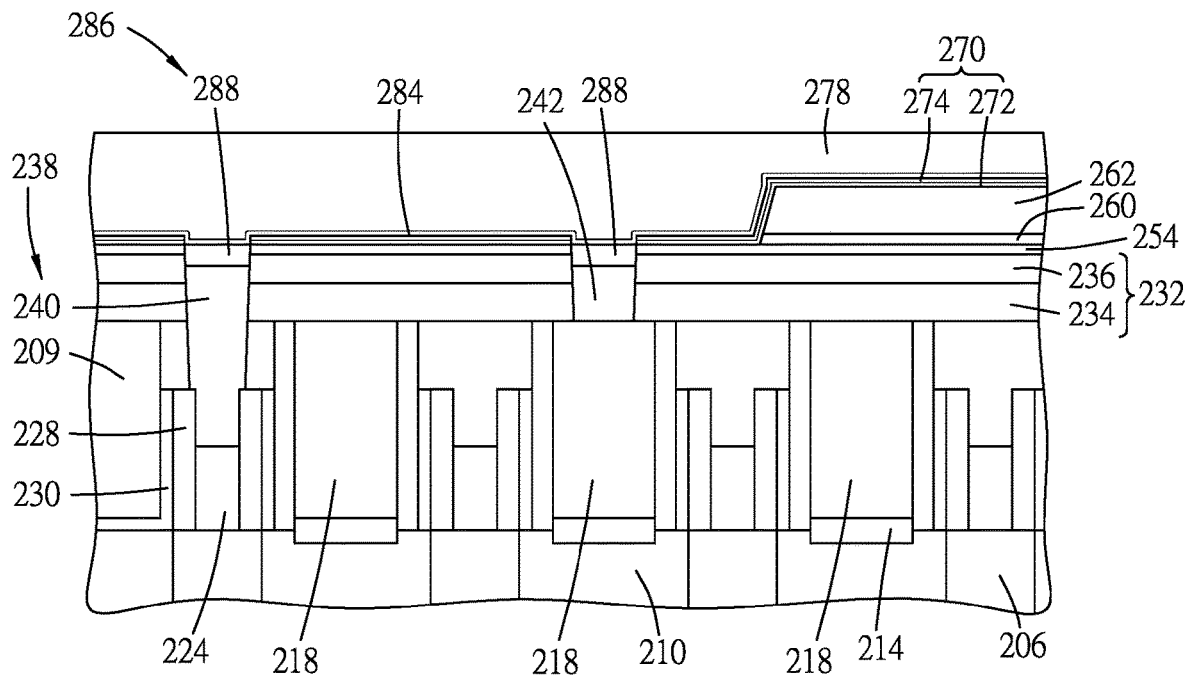
Figure 46:
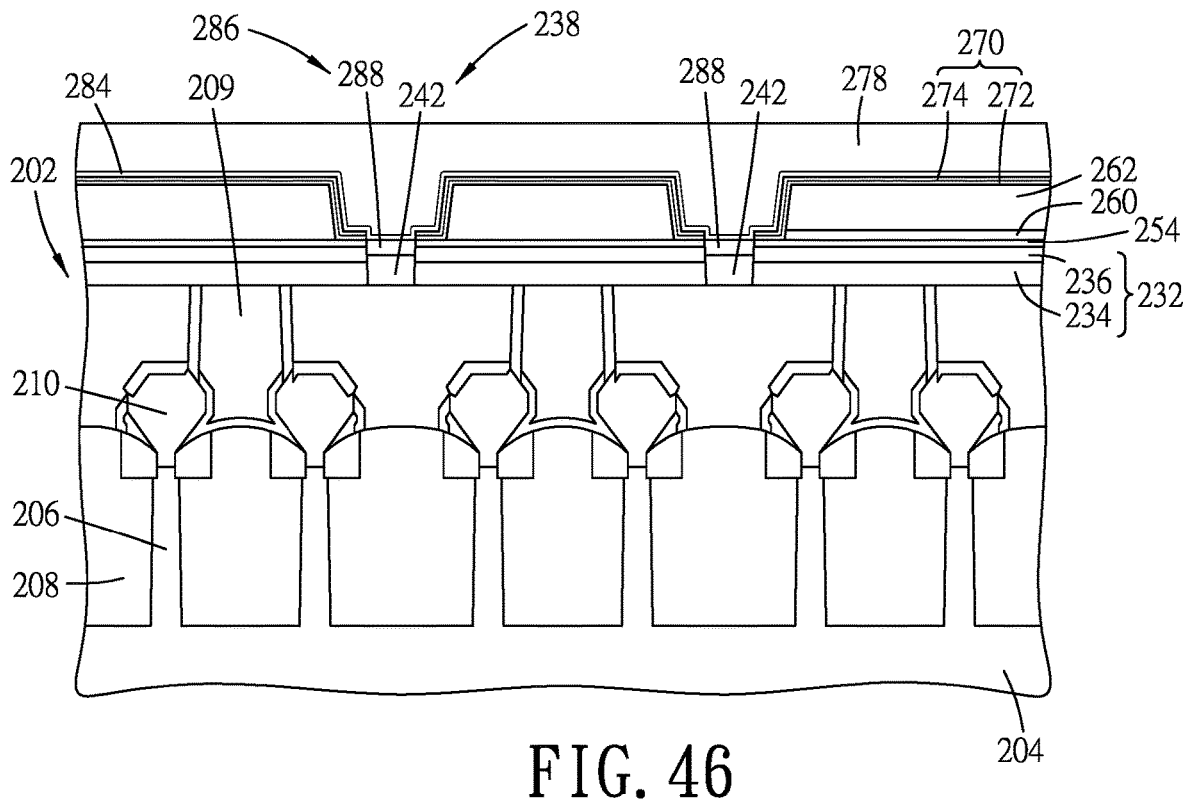

Referring to FIG. 30, in a step 304 of the method 300, a metal nitride feature is formed. Referring to FIGS. 33 and 34, in some embodiments, the metal nitride feature 286 is formed. In some embodiments, the metal nitride feature 286 includes a plurality of metal nitride structures 288 that are formed by nitriding top portions of the gate contacts 240 and the source/drain contacts 242 of the contact feature 238. In some embodiments, the metal nitride feature 286 may be formed by treating the contact feature 238 with a nitrogen-containing plasma, such as $NH_3$ plasma, $N_2$ plasma, other suitable types of plasma, or any combination thereof. In some embodiments, the nitrided layer 254 is formed as a result of the nitrogen-containing plasma treatment. In some embodiments, each of the gate contacts 240 and the source/drain contacts 242 of the contact feature 238 may include the metal (M1) that may include W, Mo, Ru, Co, Ni, Ir, Rh, Os, other suitable materials, or any combination thereof. Therefore, the metal nitride structures 288 of the metal nitride feature 286 may include MIN (i.e., nitride of M1). In some embodiments, the metal nitride structures 288 of the metal nitride feature 286 may be slightly oxidized, and may therefore include M1N and M1O (i.e., oxide of M1). In some embodiments, the metal nitride structures 288 of the metal nitride feature 286 may be crystalline; and, in other embodiments, the metal nitride structures 288 of the metal nitride feature 286 may be turned into an amorphous phase by the abovementioned implantation with nitrogen or germanium. In some embodiments, if germanium is used for implantation, the metal nitride structures 288 of the metal nitride feature 286 may include MlN, M1O, GeN and GeO, and the nitrided layer 254 may include germanium. In some embodiments, the implantation of germanium may be conducted with an ion beam energy ranging from about 0.6 keV to about 1 keV but other ranges of values are also within the scope of this disclosure, and with an implantation does ranging from about 1E14 atom/cm$^2$ to about 1E16 atom/cm$^2$ but other ranges of values are also within the scope of this disclosure. In some embodiments, the implantation angle may range from about 0° to about 5° but other ranges of values are also within the scope of this disclosure. In some embodiments, if the ion beam energy is too low, such as lower than about 0.6 keV, germanium may not be properly introduced into the metal nitride structures 288 of the metal nitride feature 286. In some embodiments, if the ion beam energy is too high, such as higher than about 1 keV, the semiconductor structure 202 may be damaged. In some embodiments, if the implantation dose is too low, such as lower than about 1E14 atom/cm$^2$, germanium may not be properly introduced into the metal nitride structures 288 of the metal nitride feature 286. In some embodiments, if the implantation dose is too high, such as higher than about 1E16 atom/cm$^2$, the semiconductor structure 202 may be damaged. In some embodiments, if the implantation angle is too large, such as larger than about 5°, germanium may not be properly introduced into the metal nitride structures 288 of the metal nitride feature 286. In some embodiments, the amount of M1 in each of the metal nitride structures 288 of the metal nitride feature 286 may range from about 80% to about 90% (e.g., may be in weight percent), but other ranges of values are also within the scope of this disclosure. In some embodiments, if the amount of M1 in each of the metal nitride structures 288 of the metal nitride feature 286 is too small, such as smaller than about 80%, the resistance of the metal nitride structures 288 of the metal nitride feature 286 may be increased. In some embodiments, if the amount of M1 in each of the metal nitride structures 288 of the metal nitride feature 286 is too large, such as greater than about 90%, the amount of nitrogen in each of the metal nitride structures 288 of the metal nitride feature 286 may be too small, leading to poor adhesion of the metal nitride structures 288 of the metal nitride feature 286 to the second dielectric feature 232 and the metal nitride structures 288 of the metal nitride feature 286 may not effectively block outward-diffusion of the metals from the conductive lines 282 of the conductive line feature 280. In some embodiments, the amount of nitrogen in each of the metal nitride structures 288 of the metal nitride feature 286 may range from about 5% to about 10%, but other ranges of values are also within the scope of this disclosure. In some embodiments, if the amount of nitrogen in each of the metal nitride structures 288 of the metal nitride feature 286 is too small, such as smaller than about 5%, adhesion of the metal nitride structures 288 of the metal nitride feature 286 to the second dielectric feature 232 may be deteriorated and metal nitride structures 288 of the metal nitride feature 286 may not effectively block outward-diffusion of the metals from the conductive lines 282 of the conductive line feature 280. In some embodiments, if the amount of nitrogen in each of the metal nitride structures 288 of the metal nitride feature 286 is too large, such as greater than about 10%, the resistance of the metal nitride structures 288 of the metal nitride feature 286 may be increased. In some embodiments, the amount of oxygen in each of the metal nitride structures 288 of the metal nitride feature 286 may be less than about 10%, but other ranges of values are also within the scope of this disclosure. In some embodiments, if the amount of oxygen in each of the metal nitride structures 288 of the metal nitride feature 286 is too large, such as greater than about 10%, the resistance of the metal nitride structures 288 of the metal nitride feature 286 may be increased. In some embodiments, if the metal nitride structures 288 of the metal nitride feature 286 contains germanium, the amount of germanium in each of the metal nitride structures 288 of the metal nitride feature 286 may range from about 1% to about 5%, but other ranges of values are also within the scope of this disclosure. In some embodiments, if the amount of germanium in each of the metal nitride structures 288 of the metal nitride feature 286 is too small, such as smaller than about 1%, the implantation energy of germanium may be insufficient, and the metal nitride structures 288 of the metal nitride feature 286 may not be turned into amorphous form. In some embodiments, if the amount of germanium in each of the metal nitride structures 288 of the metal nitride feature 286 is too large, such as greater than about 5%, the resistance of the metal nitride structures 288 of the metal nitride feature 286 may be increased.

Referring to FIG. 30, in a step 306 of the method 300, the conductive line feature is formed, which is illustrated by FIGS. 35 to 48. The processes illustrated by FIGS. 35 to 48 are similar to the processes illustrated by FIGS. 14 to 29 with any necessary changed based on practical requirements, and are therefore not described for the sake of brevity.

Figure 47:
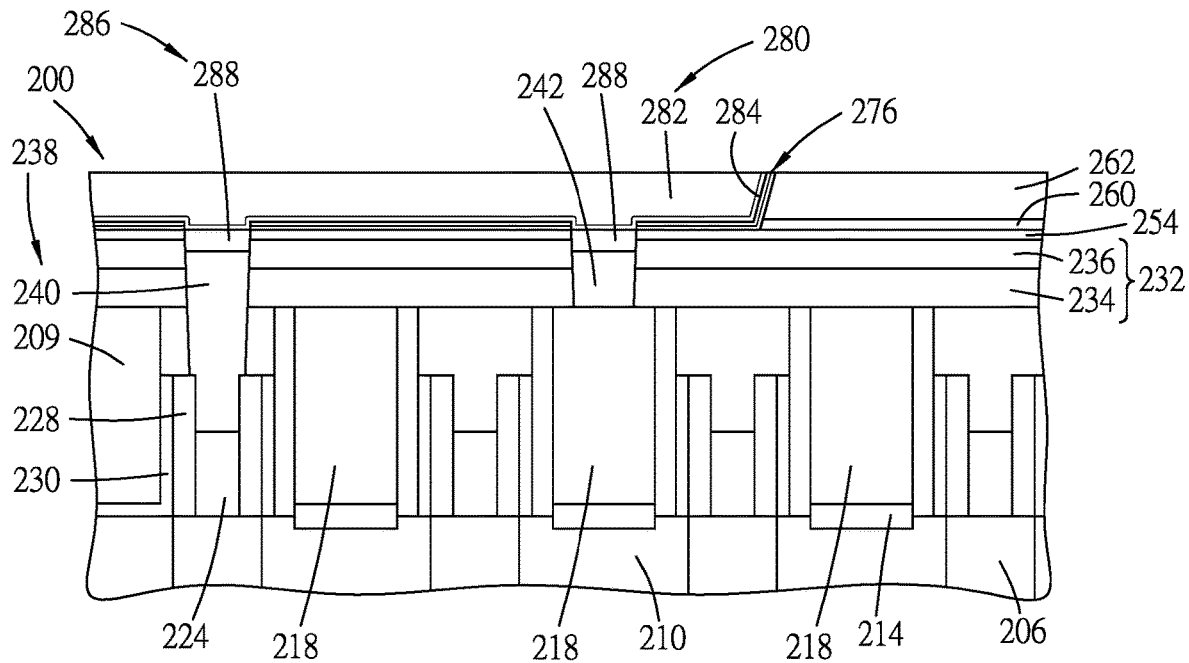
Figure 48:
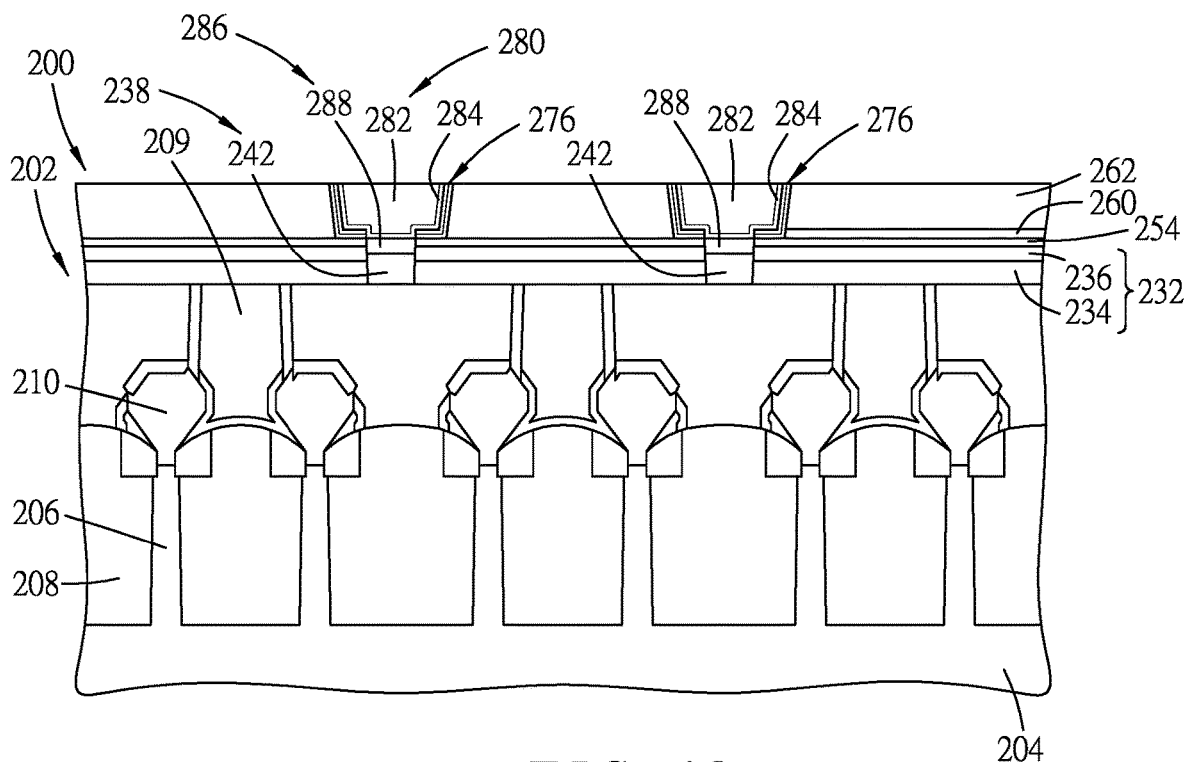

Referring to FIGS. 47 and 48, in some embodiments, each of the metal nitride structures 288 of the metal nitride feature 286 may have a thickness ranging from about 0.5 nm to about 4 nm, but other ranges of values are also within the scope of this disclosure. The metal nitride structures 288 of the metal nitride feature 286 may block metals from diffusing from the conductive lines 282 of the conductive line feature 280 into the semiconductor structure 202 (i.e., outward-diffusion of the metals from the conductive lines 282 of the conductive line feature 280). In some embodiments, if the thickness of each of the metal nitride structures 288 of the metal nitride feature 286 is too small, such as smaller than about 0.5 nm, the metal nitride structures 288 of the metal nitride feature 286 may not effectively block the outward-diffusion of the metals from the conductive lines 282 of the conductive line feature 280. In some embodiments, if the thickness of each of the metal nitride structures 288 of the metal nitride feature 286 is too large, such as greater than about 4 nm, the resistance between the conductive line feature 280 and the contact feature 238 may be too large.

The embodiments of the present disclosure have some advantageous features. This disclosure provides a metal-nitride layer or an alloy-nitride layer (may be collectively referred to as a conductive nitride feature) (i.e., the alloy nitride structures 258 of the alloy nitride feature 256 and the metal nitride structures 288 of the metal nitride feature 286), which may block outward-diffusion of the metals from the conductive lines 282 of the conductive line feature 280. In addition, the nitrogen in the conductive nitride feature may promote adhesion between the alloy nitride structures 258 of the alloy nitride feature 256 and the metal nitride structures 288 of the metal nitride feature 286 and the second dielectric feature 232. Depending on the reactivity of the metal (M1) of the gate contacts 240 and the source/drain contacts 242 of the contact feature 238, the metal-nitride layer or the alloy-nitride layer can be formed. For example, when M1 is less reactive, the alloy M1M2 can be first formed, followed by introducing nitrogen to form $M1_x(M2N)_y$. When M1 is more reactive, the metal-nitride layer (i.e., M1N) is formed without forming the alloy nitride, and metal oxide (M1O) may also be formed due to the higher reactivity of M1, where both M1N and M1O may help to block outward-diffusion of the metals from the conductive lines 282 of the conductive line feature 280. In addition, by making the metal-nitride layer (or alloy-nitride layer) to be amorphous, outward-diffusion of the metals through grain boundaries of the metal-nitride layer (or alloy-nitride layer) can be prevented.

In accordance with some embodiments of the present disclosure, a semiconductor device includes a semiconductor structure, a conductive nitride feature, a third dielectric feature, and a conductive line feature. The semiconductor structure includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature that is disposed in the second dielectric feature and that is connected to at least one of the source/drain regions and the gate structure. The conductive nitride feature includes metal nitride or alloy nitride, is disposed in the second dielectric feature, and is connected to the contact feature. The third dielectric feature is disposed over the second dielectric feature. The conductive line feature is disposed in the third dielectric feature and is connected to the conductive nitride feature opposite to the contact feature.

In accordance with some embodiments of the present disclosure, the contact feature includes a metal (M1). The conductive nitride feature includes a material of MIN or $M1_x(M2N)_y$, M2 being a metal different from M1.

In accordance with some embodiments of the present disclosure, M1 includes W, Mo, Ru, Co, Ni, Ir, Rh, or Os, and M2 includes Ti or Ta.

In accordance with some embodiments of the present disclosure, the conductive nitride feature further includes an oxide of the metal (M1).

In accordance with some embodiments of the present disclosure, the conductive nitride feature further includes a nitride of germanium and an oxide of germanium.

In accordance with some embodiments of the present disclosure, the conductive nitride feature has a thickness ranging from about 0.5 nm to about 4 nm.

In accordance with some embodiments of the present disclosure, the conductive nitride feature is amorphous.

In accordance with some embodiments of the present disclosure, the semiconductor device further includes a nitrided layer that is disposed between the second dielectric feature and the third dielectric feature, and that surrounds the conductive nitride feature.

In accordance with some embodiments of the present disclosure, the semiconductor device further includes a barrier layer structure that surrounds the conductive line feature and that is disposed outside of the conductive nitride feature.

In accordance with some embodiments of the present disclosure, a semiconductor device includes a semiconductor structure, a metal nitride feature, a third dielectric feature, a conductive line feature, and a barrier layer structure. The semiconductor structure includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature that is disposed in the second dielectric feature and that is connected to at least one of the source/drain regions and the gate structure. The metal nitride feature is disposed in the second dielectric feature, and is connected to the contact feature. The third dielectric feature is disposed over the second dielectric feature. The conductive line feature is disposed in the third dielectric feature, and is connected to the metal nitride feature opposite to the contact feature. The barrier layer structure surrounds the conductive line feature, and is disposed outside of the metal nitride feature.

In accordance with some embodiments of the present disclosure, the contact feature includes a metal (M1), and the metal nitride feature includes a nitride of the metal (M1).

In accordance with some embodiments of the present disclosure, the metal nitride feature (286) further includes an oxide of the metal (M1).

In accordance with some embodiments of the present disclosure, the metal nitride feature (286) further includes a nitride of germanium and an oxide of germanium.

In accordance with some embodiments of the present disclosure, the metal nitride feature (286) is amorphous.

In accordance with some embodiments of the present disclosure, the semiconductor device further includes a nitrided layer that is disposed between the second dielectric feature and the third dielectric feature, and that surrounds the metal nitride feature.

In accordance with some embodiments of the present disclosure, a method of making a semiconductor device includes: forming a semiconductor structure that includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature that is disposed in the second dielectric feature and that is connected to at least one of the source/drain regions and the gate structure; introducing nitrogen into the contact feature, so that top portion of the contact feature is formed into a conductive nitride feature; and forming a conductive line feature over the conductive nitride feature to be connected to the conductive nitride feature.

In accordance with some embodiments of the present disclosure, the method of making the semiconductor device further includes, prior to the introduction of nitrogen, introducing a metal into the contact feature, so that the top portion of the contact feature is formed into a metal alloy, which is formed into the conductive nitride feature including alloy nitride in the step of the introduction of nitrogen.

In accordance with some embodiments of the present disclosure, in the step of introducing the metal into the contact feature, a metal layer is formed over the semiconductor structure and is in contact with the contact feature, followed by reacting the metal layer with the top portion of the contact feature, so that the top portion of the contact feature is formed into the metal alloy.

In accordance with some embodiments of the present disclosure, the method of making the semiconductor device further includes, during the formation of the conductive line feature, the steps of: selectively forming a blocking layer on the conductive nitride feature; selectively forming a barrier layer feature over the semiconductor structure outside of the blocking layer; removing the blocking layer; forming a filling conductive material over the barrier layer feature and being in contact with the conductive nitride feature; and removing a portion of the filling conductive material and a portion of the barrier layer feature to form the conductive line feature and a barrier layer structure that surrounds the conductive line feature and that is disposed outside of the conductive nitride feature.

In accordance with some embodiments of the present disclosure, the method of making the semiconductor device further includes, after the introduction of nitrogen and prior to the formation of the conductive line feature, introducing nitrogen or germanium into the conductive nitride feature to turn the conductive nitride feature into amorphous structure.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor structure that includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature that is disposed in the second dielectric feature and that is connected to at least one of the source/drain regions and the gate structure;
a conductive nitride feature that includes metal nitride or alloy nitride, that is disposed in the second dielectric feature, and that is connected to the contact feature;
a third dielectric feature that is disposed over the second dielectric feature; and
a conductive line feature that is disposed in the third dielectric feature and that is connected to the conductive nitride feature opposite to the contact feature,
wherein the conductive nitride feature is amorphous.

2. The semiconductor device as claimed in claim 1, wherein:
the contact feature includes a metal (M1); and
the conductive nitride feature includes a material of M1N or $M1_x(M2N)_y$, M2 being a metal different from M1.

3. The semiconductor device as claimed in claim 2, wherein:
M1 includes W, Mo, Ru, Co, Ni, Ir, Rh, or Os; and
M2 includes Ti or Ta.

4. The semiconductor device as claimed in claim 2, wherein the conductive nitride feature further includes an oxide of the metal (M1).

5. The semiconductor device as claimed in claim 4, wherein the conductive nitride feature further includes a nitride of germanium and an oxide of germanium.

6. The semiconductor device as claimed in claim 1, wherein the conductive nitride feature has a thickness ranging from about 0.5 nm to about 4 nm.

7. The semiconductor device as claimed in claim 1, further comprising a nitrided layer that is disposed between the second dielectric feature and the third dielectric feature, and that surrounds the conductive nitride feature.

8. The semiconductor device as claimed in claim 7, further comprising an etch stop layer disposed between the nitrided layer and the third dielectric feature.

9. The semiconductor device as claimed in claim 1, further comprising a barrier layer structure that surrounds the conductive line feature and that is disposed outside of the conductive nitride feature.

10. A semiconductor device comprising:
a semiconductor structure that includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature that is disposed in the second dielectric feature and that is connected to at least one of the source/drain regions and the gate structure;
a metal nitride feature that is disposed in the second dielectric feature and that is connected to the contact feature;
a third dielectric feature that is disposed over the second dielectric feature;
a conductive line feature that is disposed in the third dielectric feature and that is connected to the metal nitride feature opposite to the contact feature; and
a barrier layer structure that surrounds the conductive line feature and that is disposed outside of the metal nitride feature,
wherein the metal nitride feature is amorphous.

11. The semiconductor device as claimed in claim 10, wherein:
the contact feature includes a metal (M1); and
the metal nitride feature includes a nitride of the metal (M1).

12. The semiconductor device as claimed in claim 11, wherein the metal nitride feature further includes an oxide of the metal (M1).

13. The semiconductor device as claimed in claim 12, wherein the metal nitride feature further includes a nitride of germanium and an oxide of germanium.

14. The semiconductor device as claimed in claim 10, further comprising a nitrided layer that is disposed between the second dielectric feature and the third dielectric feature, and that surrounds the metal nitride feature.

15. The semiconductor device as claimed in claim 14, further comprising an etch stop layer disposed between the nitrided layer and the third dielectric feature.

16. A method of making a semiconductor device, comprising:
forming a semiconductor structure that includes a substrate, two source/drain regions disposed in the substrate, a first dielectric feature disposed over the substrate, a gate structure disposed in the first dielectric feature and between the source/drain regions, a second dielectric feature disposed over the first dielectric feature, and a contact feature that is disposed in the second dielectric feature and that is connected to at least one of the source/drain regions and the gate structure;
introducing nitrogen into the contact feature, so that top portion of the contact feature is formed into a conductive nitride feature; and
forming a conductive line feature over the conductive nitride feature to be connected to the conductive nitride feature.

17. The method as claimed in claim 16, further comprising, prior to the introduction of nitrogen, introducing a metal into the contact feature, so that the top portion of the contact feature is formed into a metal alloy, which is formed into the conductive nitride feature including alloy nitride in the step of the introduction of nitrogen.

18. The method as claimed in claim 17, wherein, in the step of introducing the metal into the contact feature, a metal layer is formed over the semiconductor structure and is in contact with the contact feature, followed by reacting the metal layer with the top portion of the contact feature, so that the top portion of the contact feature is formed into the metal alloy.

19. The method as claimed in claim 16, further comprising, during the formation of the conductive line feature, the steps of:

selectively forming a blocking layer on the conductive nitride feature;

selectively forming a barrier layer feature over the semiconductor structure outside of the blocking layer;

removing the blocking layer;

forming a filling conductive material over the barrier layer feature and being in contact with the conductive nitride feature; and removing a portion of the filling conductive material and a portion of the barrier layer feature to form the conductive line feature and a barrier layer structure that surrounds the conductive line feature and that is disposed outside of the conductive nitride feature.

20. The method as claimed in claim 16, further comprising, after the introduction of nitrogen and prior to the formation of the conductive line feature, introducing nitrogen or germanium into the conductive nitride feature to turn the conductive nitride feature into amorphous structure.

* * * * *